United States Patent
Takahashi et al.

(10) Patent No.: US 10,204,563 B2
(45) Date of Patent: Feb. 12, 2019

(54) SEMICONDUCTOR DEVICE, DRIVER IC, DISPLAY DEVICE, AND ELECTRONIC DEVICE, EACH INCLUDING PASS TRANSISTOR LOGIC CIRCUIT INCLUDING DEMULTIPLEXER

(71) Applicant: Semiconductor Energy Laboratory Co., Ltd., Kanagawa-ken (JP)

(72) Inventors: Kei Takahashi, Kanagawa (JP); Hidetomo Kobayashi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 329 days.

(21) Appl. No.: 14/837,595

(22) Filed: Aug. 27, 2015

(65) Prior Publication Data

US 2016/0071463 A1 Mar. 10, 2016

(30) Foreign Application Priority Data

Sep. 5, 2014 (JP) .................. 2014-181427

(51) Int. Cl.
*H01L 27/32* (2006.01)
*H03K 17/00* (2006.01)
(Continued)

(52) U.S. Cl.
CPC ......... *G09G 3/3275* (2013.01); *G09G 3/3225* (2013.01); *G09G 3/3291* (2013.01);
(Continued)

(58) Field of Classification Search
None
See application file for complete search history.

(56) References Cited

U.S. PATENT DOCUMENTS 5,583,502 A 12/1996 Takeuchi et al.
8,094,107 B2 1/2012 Nishimura et al.
(Continued)

FOREIGN PATENT DOCUMENTS

JP 07-131347 A 5/1995
JP 2007-285764 A 11/2007
(Continued)

OTHER PUBLICATIONS

International Search Report re Application No. PCT/IB2015/056418, dated Dec. 1, 2015.

(Continued)

*Primary Examiner* — David D Davis
(74) *Attorney, Agent, or Firm* — Husch Blackwell LLP

(57) ABSTRACT

A semiconductor device including a test circuit is miniaturized. The semiconductor device includes r first input terminals (r is an integer of 2 or more), a second input terminal, r functional circuits, a demultiplexer, and a switch circuit. The demultiplexer is a pass transistor logic circuit. R output terminals of the demultiplexer are electrically connected to respective input terminals of the functional circuit and the input terminal is electrically connected to the second input terminal. Input terminals of the r circuits are electrically connected to the respective first input terminals through the switch circuit. For example, a signal for verification is input to the first input terminal in verification of the functional circuit to operate the demultiplexer. One signal for verification is input to r functional circuits by the demultiplexer.

7 Claims, 21 Drawing Sheets

(51) Int. Cl.
  *G09G 3/3225*   (2016.01)
  *G09G 3/3275*   (2016.01)
  *G09G 3/3291*   (2016.01)
  *H01L 29/786*   (2006.01)

(52) U.S. Cl.
  CPC ...... *H01L 27/3262* (2013.01); *H01L 27/3276* (2013.01); *H01L 29/7869* (2013.01); *H03K 17/007* (2013.01); *G09G 2300/0842* (2013.01); *G09G 2300/0861* (2013.01); *G09G 2310/027* (2013.01); *G09G 2310/0262* (2013.01); *G09G 2310/0297* (2013.01); *G09G 2320/0295* (2013.01)

(56) References Cited

U.S. PATENT DOCUMENTS

| | | | |
|---|---|---|---|
| 9,041,453 B2 | 5/2015 | Miyake et al. | |
| 2009/0303219 A1* | 12/2009 | Kimura | G09G 3/3688 345/211 |
| 2013/0119412 A1* | 5/2013 | Kasai | H01L 27/3258 257/88 |
| 2015/0015474 A1 | 1/2015 | Miyake et al. | |
| 2015/0187818 A1 | 7/2015 | Miyake et al. | |

FOREIGN PATENT DOCUMENTS

| | | |
|---|---|---|
| JP | 2007-286525 | 11/2007 |
| JP | 2009-105553 A | 5/2009 |
| JP | 2009-265459 | 11/2009 |

OTHER PUBLICATIONS

Written Opinion re Application No. PCT/IB2015/056418, dated Dec. 1, 2015.

* cited by examiner

PTL131

DEMUX 312

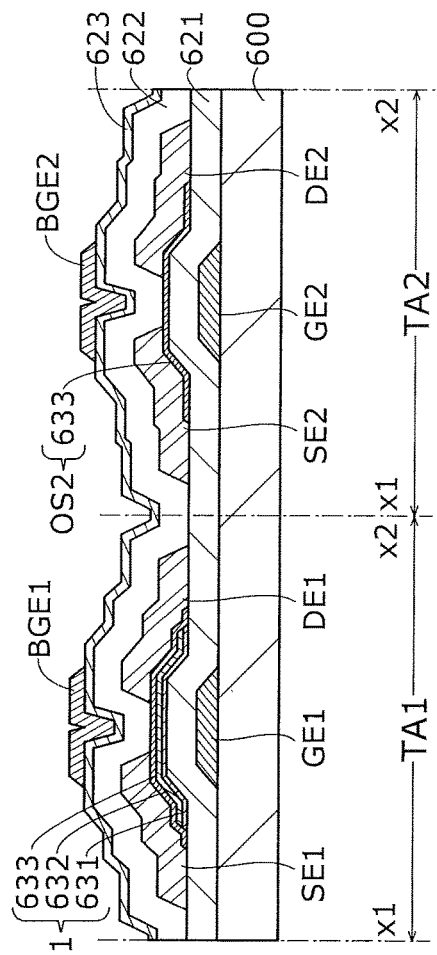
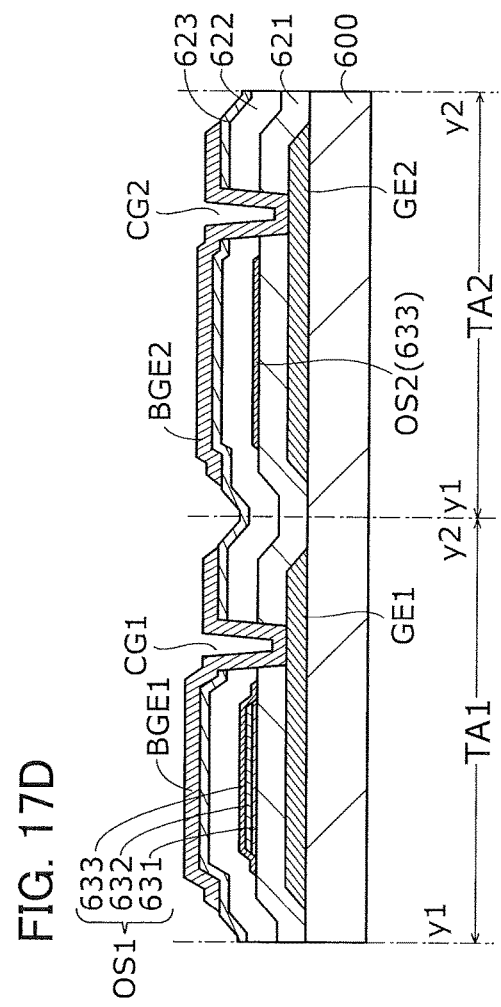
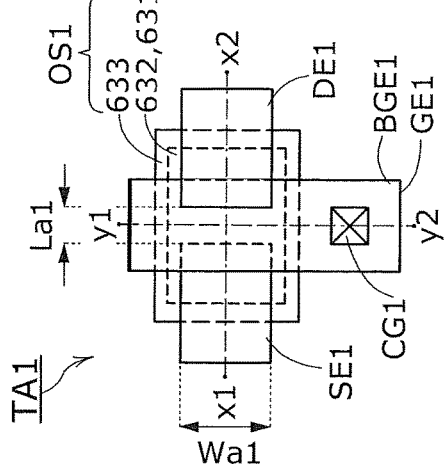
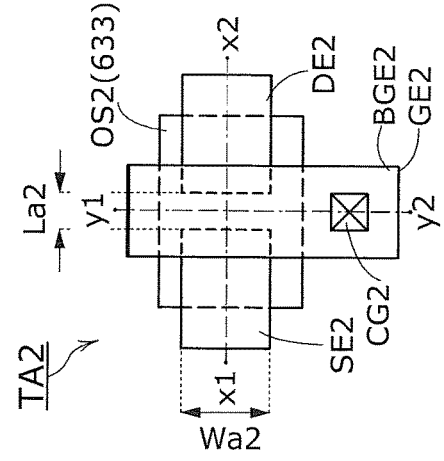

SEMICONDUCTOR DEVICE, DRIVER IC, DISPLAY DEVICE, AND ELECTRONIC DEVICE, EACH INCLUDING PASS TRANSISTOR LOGIC CIRCUIT INCLUDING DEMULTIPLEXER

TECHNICAL FIELD

One embodiment of the present invention relates to a circuit, a processing circuit, or a storage circuit including a semiconductor; a semiconductor device such as a display device or a light-emitting device; a driving method thereof; a manufacturing method thereof; or the like.

BACKGROUND ART

As for pixels of active matrix display devices using light-emitting elements, a variety of circuit configurations are proposed. In general, a pixel is provided with at least a light-emitting element, a transistor which controls input of a data signal to the pixel, and a transistor which controls a current supplied to the light-emitting element (driving transistor). Supplying a drain current flowing in the driving transistor to the light-emitting element makes the light-emitting element emit light at a luminance corresponding to the drain current value. The drain current of the driving transistor is controlled by the voltage of a data signal.

Therefore, when there is a variation in the electrical characteristics (such as the threshold voltage and the field-effect mobility) of the driving transistor between a plurality of pixels included in a screen of a display device, a variation in the luminance of the light-emitting element is caused even when data signals with the same voltage are supplied to these pixels. The variation in the electrical characteristics of the driving transistor between a plurality of pixels is a cause of a reduction in the display quality of the display device.

Meanwhile, an increase in the number of pixels in an active matrix display device is advanced to achieve high resolution, and as many as hundreds of thousands to tens of millions of pixels are provided in one display device. For example, in the case of a resolution of full-HD, the number of pixels is 1366×768×3 (RGB)=1,049,088; and in the case of 8K4K (Super Hi-Vision), it is 7,680×4,320×3 (RGB)=33,177,600. It is extremely difficult to completely match the electrical characteristics of driving transistors in a large number of pixels. Thus, obtaining electrical characteristics of the driving transistor and correcting the luminance of the light-emitting element are proposed (e.g., see Patent Document 1).

To meet demand for multiple gray levels, higher definition, and the like of a display portion, a dedicated IC (a driver IC) is used as a driver circuit of a display device, particularly as a source driver circuit for generating a data signal from an image signal (e.g., see Patent Document 2).

REFERENCE

Patent Documents

[Patent Document 1] Japanese Published Patent Application No. 2009-265459
[Patent Document 2] Japanese Published Patent Application No. 2007-286525

DISCLOSURE OF INVENTION

To increase the resolution, the number of circuits in the driver circuit as well as that in the pixel portion is increased. For example, in the case where a test circuit for verifying the operation is incorporated in the driver IC, the size of the test circuit is also increased.

Furthermore, a circuit for obtaining the electrical characteristics of the driving transistor in the pixel handles a signal with an extremely small current of approximately 1 nA to several hundreds of nA flowing in the pixel. Thus, in the case where the operation of this circuit is verified, such an extremely small current signal is preferably used.

Then, an object of one embodiment of the present invention is to provide a novel semiconductor device or a method for operating the novel semiconductor device. Another object of one embodiment of the present invention is to miniaturize a semiconductor device or to provide a semiconductor device that can verify the operation with high accuracy.

Note that the description of a plurality of objects does not mutually preclude the existence. One embodiment of the present invention does not necessarily achieve all the objects. Objects other than those listed above will be apparent from the description of the specification, drawings, and claims, and also such objects could be an object of one embodiment of the present invention.

One embodiment of the present invention is a semiconductor device including r circuits (r is an integer of 2 or more) and a demultiplexer including r output terminals. The demultiplexer is a pass transistor logic circuit (pass transistor logic). The r output terminals of the demultiplexer are electrically connected to the respective circuits.

One embodiment of the present invention is a semiconductor device including r first input terminals (r is an integer of 2 or more), a second input terminal, r circuits, a demultiplexer including r output terminals, and a switch circuit. The demultiplexer is a pass transistor logic circuit. The r output terminals of the demultiplexer are electrically connected to respective input terminals of the circuits. An input terminal of the demultiplexer is electrically connected to the second input terminal. The input terminals of the r circuits are electrically connected to the respective first input terminals and electrical continuity between the input terminal of the circuit and the corresponding first input terminal is controlled by the switch circuit.

For example, any of the semiconductor devices of the above embodiment can be used in a driver IC of a display device.

In this specification and the like, ordinal numbers such as first, second, and third are used to avoid confusion among components, and the terms do not limit the components numerically or do not limit the order.

In this specification and the like, a semiconductor device refers to a device that utilizes semiconductor characteristics, and means a circuit including a semiconductor element (e.g., a transistor or a diode), a device including the circuit, and the like. The semiconductor device also means any device that can function by utilizing semiconductor characteristics. For example, an integrated circuit, and a chip including an integrated circuit are all semiconductor devices. Moreover, a memory device, a display device, a light-emitting device, a lighting device, an electronic device, and the like themselves might be semiconductor devices, or might each include a semiconductor device.

Note that a transistor includes three terminals: a gate, a source, and a drain. The gate functions as a control terminal for controlling electrical continuity of the transistor. Depending on the conductivity type of the transistor or levels of potentials applied to the terminals, one of terminals functions as a source and the other functions as a drain.

Therefore, the terms "source" and "drain" can be switched in this specification and the like. In this specification and the like, the two terminals other than the gate may be referred to as a first terminal and a second terminal.

A node can be referred to as a terminal, a wiring, an electrode, a conductor, an impurity region, or the like depending on a circuit configuration, a device structure, and the like. Furthermore, a terminal and the like can be referred to as a node.

A voltage refers to a potential difference between a certain potential and a reference potential (e.g., a ground potential (GND) or a source potential) in many cases. A voltage can be referred to as a potential and vice versa. Note that the potential indicates a relative value. Accordingly, "ground potential" does not necessarily mean 0 V.

Note that in this specification and the like, the terms "film" and "layer" can be interchanged depending on the case or circumstances. For example, the term "conductive layer" can be changed into the term "conductive film", and the term "insulating film" can be changed into the term "insulating layer" in some cases.

One embodiment of the present invention can provide a novel semiconductor device or a method for operating the novel semiconductor device. Alternatively, one embodiment of the present invention can miniaturize a semiconductor device or verify the operation with high accuracy.

Note that the description of the plurality of effects does not disturb the existence of other effects. In one embodiment of the present invention, there is no need to obtain all the effects described above. In one embodiment of the present invention, an object other than the above objects, an effect other than the above effects, and a novel feature will be apparent from the description of the specification and the drawings.

BRIEF DESCRIPTION OF DRAWINGS

In the accompanying drawings:

FIGS. 17A to 17D illustrate structure examples of transistors;

BEST MODE FOR CARRYING OUT THE INVENTION

Figure 1:
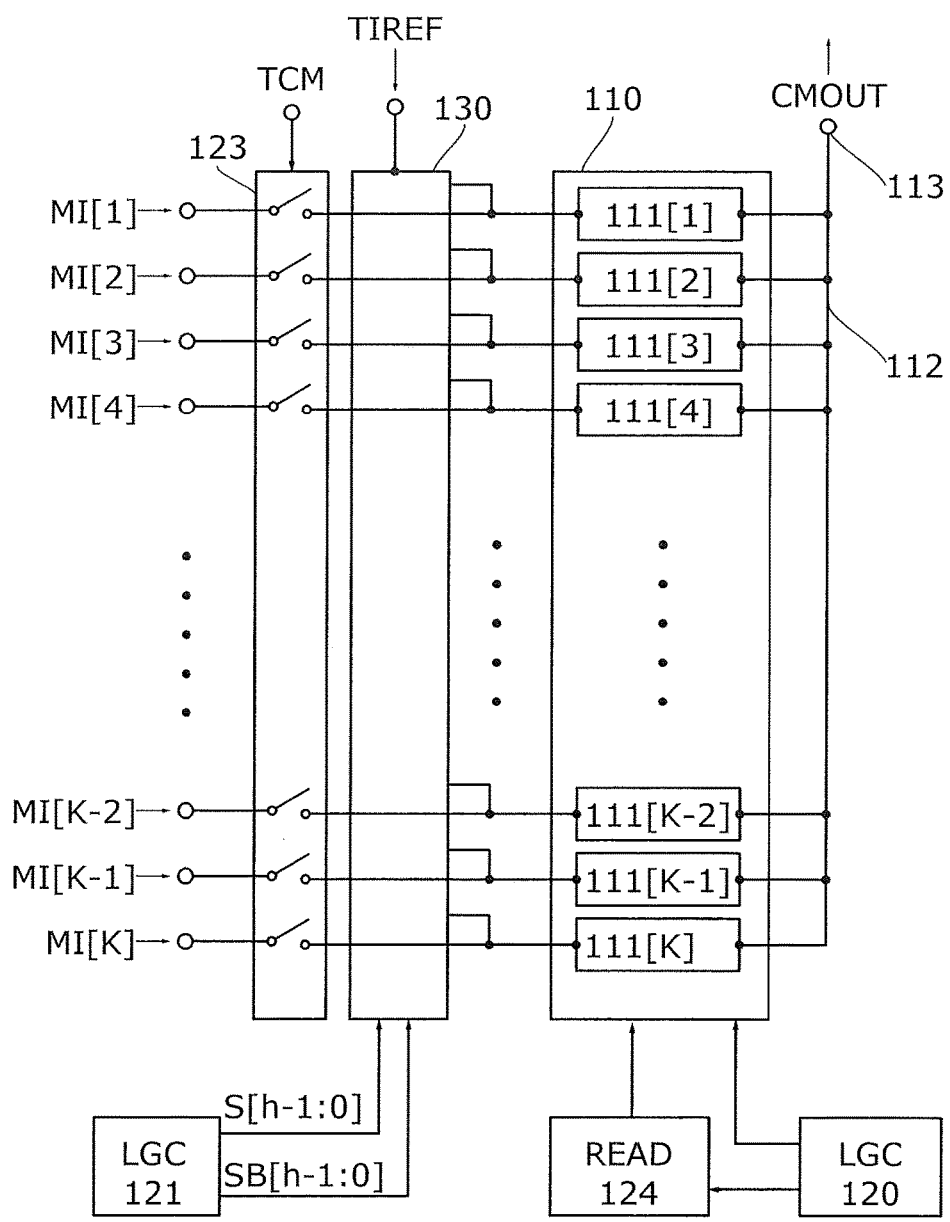
FIG. 1 illustrates a configuration example of a semiconductor device.

Embodiments of the present invention will be described below. Note that one embodiment of the present invention is not limited to the following description. It will be readily appreciated by those skilled in the art that modes and details of the present invention can be modified in various ways without departing from the spirit and scope of the present invention. Therefore, one embodiment of the present invention should not be construed as being limited to the following description of the embodiments.

In the drawings, the same components, components having similar functions, components formed of the same material, or components formed at the same time are denoted by the same reference numerals in some cases, and description thereof is not repeated in some cases.

When the same reference numerals need to be distinguished from each other, "_1", "_2", "[n]", "[m, n]", or the like may be added to the reference numerals. For example, in the case where a plurality of wirings SL in a pixel portion are individually distinguished from each other, the wiring SL in the second column may be described as a wiring SL[2] using a column number of the pixel portion.

In this specification, for example, a clock signal CLK is abbreviated to "a signal CLK", "CLK", or the like in some cases. The same applies to other components (e.g., signal, voltage, potential, circuit, element, electrode, and wiring).

The layout of circuit blocks in a drawing is the one for specifying the positional relationship in description. Thus, even when a drawing shows that different functions are achieved in different circuit blocks, an actual circuit or region may be configured so that the different functions are achieved in the same circuit block. Furthermore, the function of each circuit block in a drawing is specified for description. Thus, even when one circuit block is illustrated, an actual circuit or region may be configured so that processing which is illustrated as being performed in the one circuit block is performed in a plurality of circuit blocks.

In this specification and the like, when it is explicitly described that X and Y are connected, the case where X and Y are electrically connected, the case where X and Y are functionally connected, and the case where X and Y are directly connected are included therein. Accordingly, without limitation to a predetermined connection relation, for example, a connection relation shown in drawings or text, another connection relation is included in the drawings or the text. X and Y each denote an object (e.g., a device, an element, a circuit, a wiring, an electrode, a terminal, a conductive film, or a layer).

In the drawings, the size, the layer thickness, or the region is exaggerated for clarity in some cases. Therefore, embodiments of the present invention are not limited to such a scale.

Note that the drawings are schematic views showing ideal examples, and embodiments of the present invention are not limited to shapes or values shown in the drawings. For example, the following can be included: variation in signal, voltage, or current due to noise or difference in timing.

Embodiments of the present invention are described below, and any of the embodiments can be combined as appropriate. In addition, in the case where some structure examples are given in one embodiment, any of the structure examples can be combined as appropriate.

(Embodiment 1)

A semiconductor device including a pass transistor logic circuit is described. Here, an example in which the pass transistor logic circuit is used in a test circuit for verifying the operation of a circuit is shown.

A semiconductor device 100 illustrated in FIG. 1 includes a circuit 110, a wiring 112, an output terminal 113, a logic circuit (LGC) 120, a logic circuit (LGC) 121, a switch circuit 123, a read circuit (READ) 124, and a pass transistor logic circuit (PTL) 130. The circuit 110 includes K-stage circuits 111 (K is an integer of 2 or more). The semiconductor device 100 further includes K input terminals and an output terminal which outputs a signal CMOUT. Signals MI[1] to MI[K] are input to the respective K input terminals.

The switch circuit 123 has a function of controlling the input of the signals MI[1] to MI[K] to the circuit 110. The switch circuit 123 includes K switches. Each switch controls the electrical continuity between the circuit 110 and any one of input terminals of the semiconductor device 100. The electrical continuity of the switches is controlled by a signal TCM.

The LGC 120 has a function of generating signals for controlling the circuit 110 and the READ 124. Each circuit 111 in the circuit 110 processes the input signal in accordance with the signal generated by the LGC 120. The READ 124 is a circuit for driving the circuit 110. The READ 124 has a function of selecting a circuit from the circuits 111[1] to 111[K] that outputs the signal in accordance with the signal generated by the LGC 120. The signals necessary for the operation of the circuit 111 and the READ 124 may be input from an external circuit of the semiconductor device 100.

The PTL 130 and the LGC 121 are circuits for verifying the operation of the circuit 110. The LGC 121 has a function of controlling the PTL 130. The LGC 121 generates signals S[h−1:0] and SB[h−1:0]. The signals SB[h−1:0] are inversion signals of the signals S[h−1:0]. The PTL 130 has a function of distributing one input signal TIREF to any one of K output wirings (K output terminals). That is, the PTL 130 functions as a demultiplexer (DEMUX). The PTL 130 selects a wiring which outputs the signal TIREF in accordance with the signals S[h−1:0] and SB[h−1:0]. Data formed by the signals S[h−1:0] and SB[h−1:0] indicates any one of circuits 111[1] to 111[K] to which the signal TIREF is input.

(Normal Operation)

In normal operation of the semiconductor device 100, K switches in the switch circuit 123 are turned on. In the circuit 110, the signals MI[1] to MI[K] are processed. The READ 124 selects any one of circuits 111[1] to 111[K], and one or a plurality of signals processed by the selected circuit 111 is output to the wiring 112. The wiring 112 is electrically connected to the output terminal 113. The signal CMOUT that is taken out from the output terminal 113 is processed by an external circuit of the semiconductor device 100. Note that in the case where the signal CMOUT is a signal group including a plurality of signals, the plurality of wirings 112 and output terminals 113 are provided in accordance with the number of signals CMOUT.

(Verification Operation)

In verification operation of the circuit 110, K switches in the switch circuit 123 are turned off. By the PTL 130, the signal TIREF is input to any one of circuits 111 that is specified by the signals S[h−1:0] and SB[h−1:0]. For example, in the case where all of the circuits 111 are verified, the signals TIREF are sequentially input to the circuits 111[1] to 111[K] by the PTL 130. By the READ 124, the signals processed by the circuits 111[1] to 111[K] are sequentially output to the wiring 112. The same signals TIREF are processed by the K circuits 111; thus, when the signal CMOUT is analyzed, the evaluation of defects, the verification of performance, or the like can be perfoimed in each circuit 111.

FIG. 1 is an example in which the output terminals of the circuits 111[1] to 111[K] are connected to the common wiring 112. The configuration of the semiconductor device 100 is not limited thereto. For example, another circuit may be electrically connected to a subsequent stage of each of the circuits 111[1] to 111[K].

<<Structure Example of PTL>>

Figure 2:
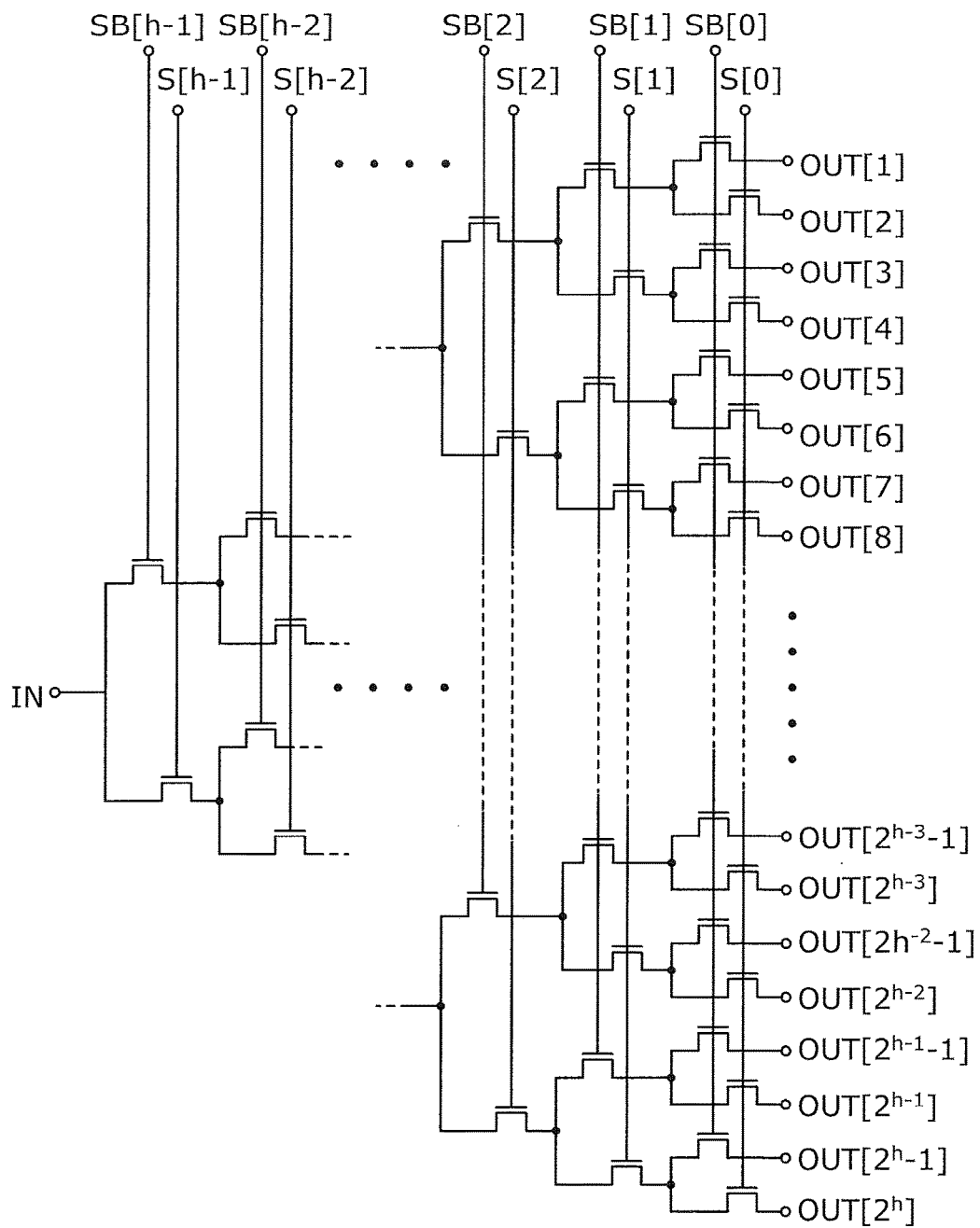
FIG. 2 is a circuit diagram illustrating a configuration example of a pass transistor logic circuit (PTL)

A semiconductor device that can be used in the PTL 130 in FIG. 1 is described. PTL 131 in FIG. 2 is a circuit in which a signal path has a tree structure and a plurality of transistors are connected in series to make a binary tree structure. Here, the transistors are n-channel transistors. The PTL 131 functions as a $2^h$-output DEMUX, and h transistors are electrically connected in series between an input terminal and each output terminal. At the q-th stage (q is an integer of 1 or more and h or less) from the output terminal, $2^{(h+1-q)}$ transistors are provided, and $2^{(h-q)}$ pairs of transistors each of which includes sources connected to the same node are provided. In the pair of transistors, the signal SB[q−1] is input to a gate of one transistor, and the signal S[q−1] is input to a gate of the other transistor.

The operation of the PTL 131 in the case where h is 4 is described as an example. In this case, the PTL 131 functions as a 16-output DEMUX. Here, for easy understanding, the signals S[3:0] are digital signals. When the data value is "1", the signals S[q−1] and SB[q−1] are at a high level (H level) and have voltages at which the transistor can be turned on, and when the data value is "0", the signals S[q−1] and SB[q−1] are at a low level (L level) and have voltages at which the transistor can be turned off. For example, when the signals S[3:0] are "0000", a signal is output from a terminal OUT[1]. When the signals S[3:0] are "0111", a signal is output from a terminal OUT[8].

Figure 3:
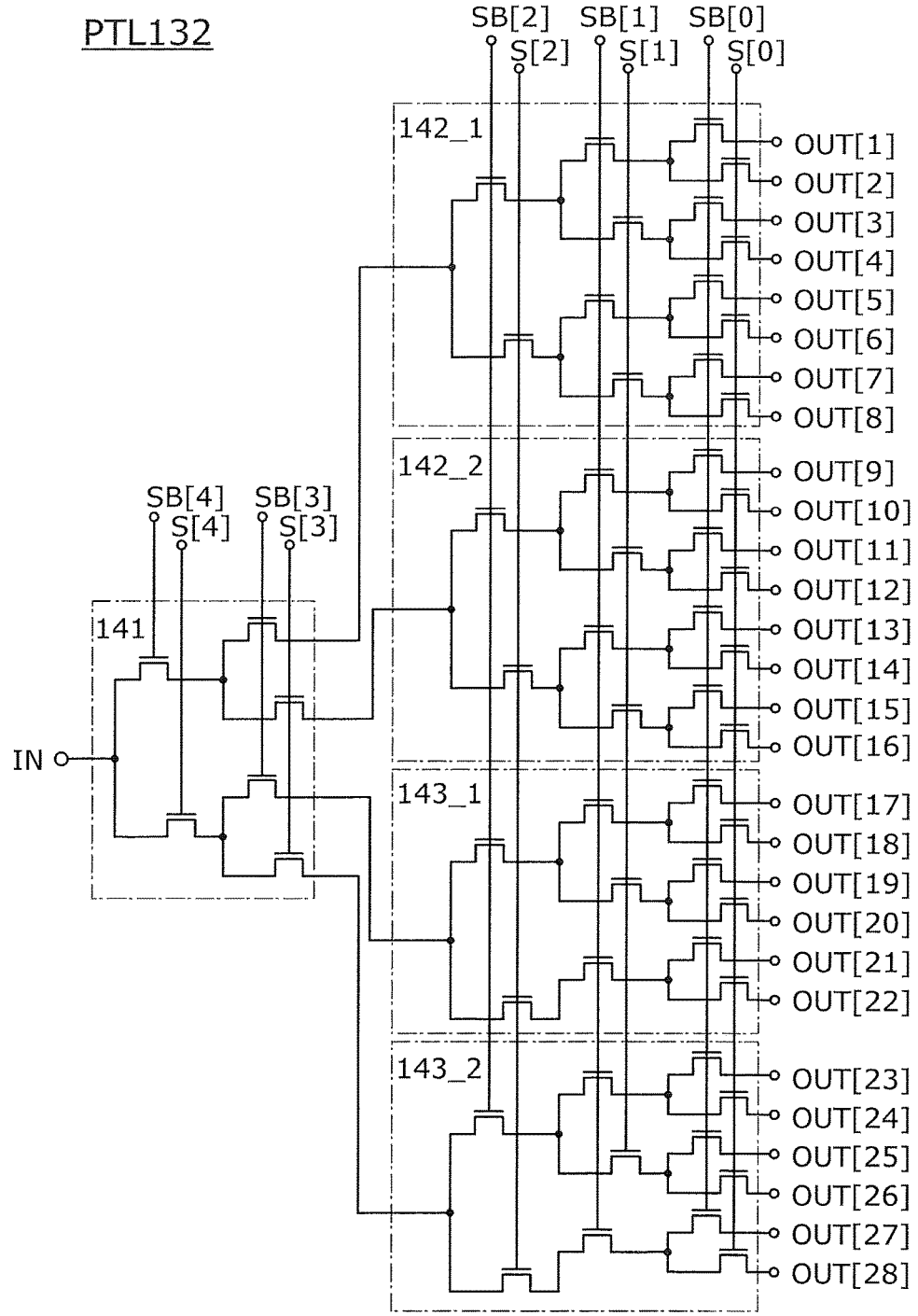
FIG. 3 is a circuit diagram illustrating a configuration example of PTL.
Figure 4:
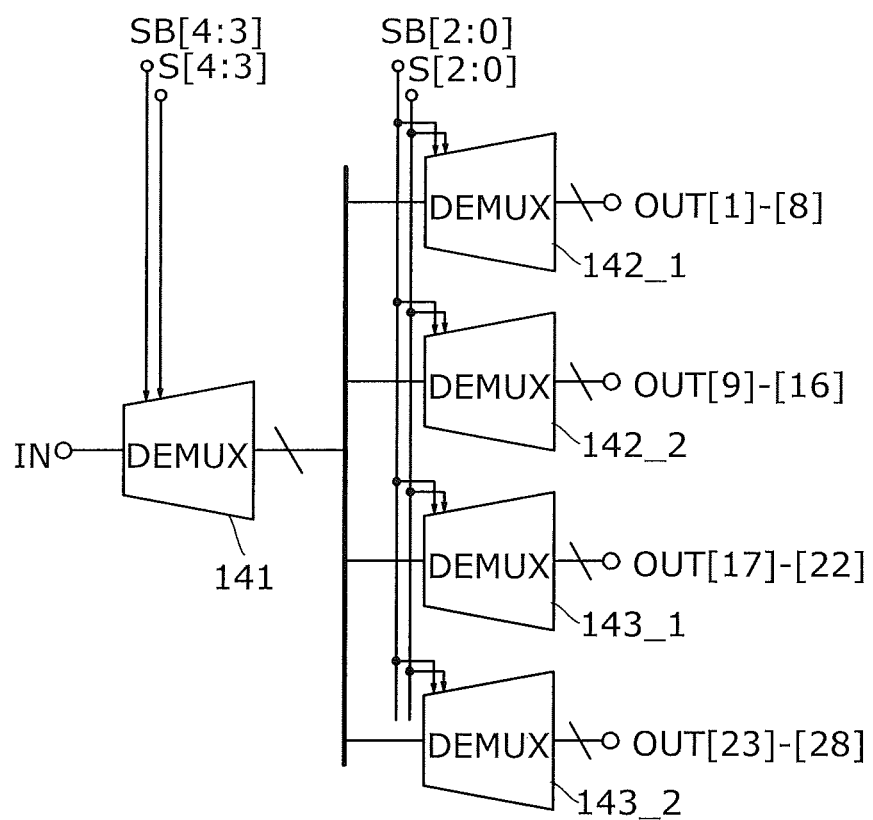
FIG. 4 is a circuit diagram illustrating a configuration example of PTL.

The number of output terminals of the PTL 131 may be changed as appropriate in accordance with the configuration of the circuits at the subsequent stage of the PTL 131. In this case, the numbers of stages of the transistors connected to the respective output terminals are preferably equal to each other. For example, a circuit configuration of PTL 132 in FIG. 3 can be employed. The PTL 132 in FIG. 3 functions as a 28-output DEMUX. To the PTL 132, the signals S[4:0] and SB[4:0] are input. FIG. 4 illustrates the PTL 132 represented by logic symbols. The PTL 132 includes one DEMUX 141, two DEMUXes 142 (142_1 and 142_2), and two DEMUXes 143 (143_1 and 143_2). The DEMUX 141 has four outputs, the DEMUX 142 has eight outputs, and the DEMUX 143 has six outputs. As illustrated in FIG. 3, the DEMUX 143 corresponds to a circuit in which three transistors are omitted from the DEMUX 142.

In examples shown in FIG. 2 and FIG. 3, p-channel transistors can be used instead of the n-channel transistors.

As illustrated in FIG. 2 and FIG. 3, when a pass transistor logic circuit functions as a demultiplexer, the number of outputs can be larger than the number of stages of pass transistors connected in series. For example, in the case where the number of stages of pass transistors is 10, the maximum number of outputs of the demultiplexer can be $2^{10}$=1024. The PTL can have a large number of outputs with a small number of elements. The test circuit does not need to be operated in normal operation; thus, it is extremely effective to form the test circuit using the PTL 130 whose circuit size is small for reducing the area overhead generated by incorporating the test circuit. This is explainable when the case where a 1024-stage shift register is provided in the semiconductor device 100 instead of the ten-stage pass transistor logic circuit is assumed.

Furthermore, in the case where the signal TIREF, which is used for verifying a number of circuits 111, is an analog signal, in particular, an analog current signal, to distribute the signal TIREF to the plurality of circuits 111 by the PTL 130 is effective for improving verification accuracy. For example, when the terminal OUT[1] is selected in verification, transistors to which the signals SB[h−1:0] are input are on and the other transistors are off. Thus, a signal output from the terminal OUT[1] is considerably affected by leakage current of the transistors in an off state. In the PTL 130, the number of stages of the transistors connected in series can be smaller than the number of output terminals; thus, a variation in the current value of an analog current and a verification error in the circuit 111 can be inhibited.

(Embodiment 2)

Here, a display device is described as an example of the semiconductor device including the pass transistor logic circuit. An example in which the semiconductor device in Embodiment 1 is provided in a driver circuit is described.

<<Display Device>>

Figure 5:
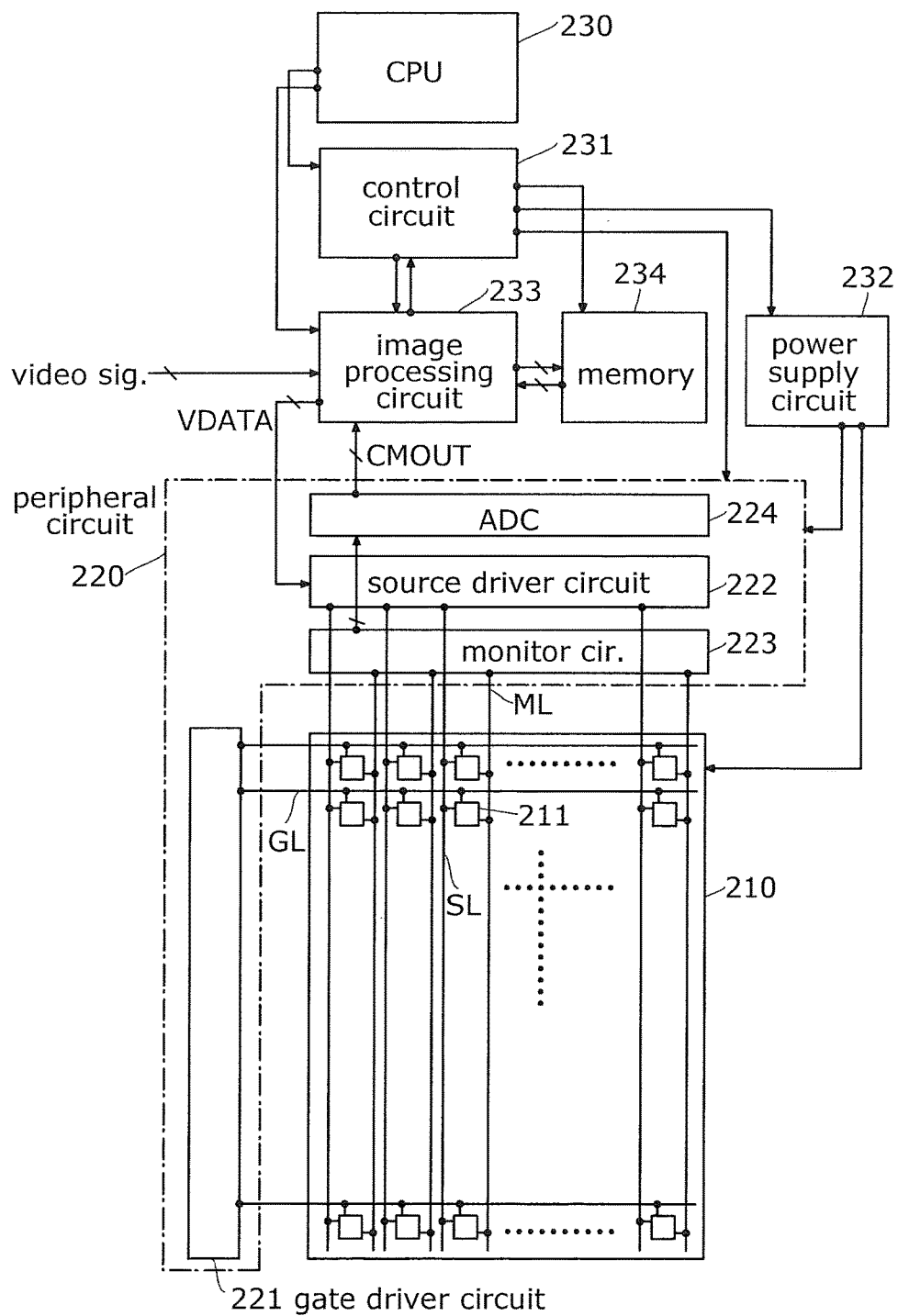
FIG. 5 illustrates a configuration example of a display device.

FIG. 5 is a block diagram illustrating a configuration example of a display device. The display device 200 includes a pixel portion 210, a peripheral circuit 220, a CPU 230, a control circuit 231, a power supply circuit 232, an image processing circuit 233, and a memory 234.

The CPU 230 is a circuit for executing an instruction and controlling the display device 200 collectively. The CPU 230 executes an instruction input from the outside and an instruction stored in an internal memory. The CPU 230 generates signals for controlling the control circuit 231 and the image processing circuit 233. On the basis of a control signal from the CPU 230, the control circuit 231 controls the operation of the display device 200. The control circuit 231 controls the peripheral circuit 220, the power supply circuit 232, the image processing circuit 233, and the memory 234 so that the process determined by the CPU 230 is executed. To the control circuit 231, for example, a variety of synchronization signals which determine timing of updating the screen are input. Examples of the synchronization signals include a horizontal synchronization signal, a vertical synchronization signal, and a reference clock signal. The control circuit 231 generates control signals of the peripheral circuit 220 from these signals. The power supply circuit 232 has a function of supplying power supply voltage to the pixel portion 210 and the peripheral circuit 220.

The pixel portion 210 includes a plurality of pixels 211, a plurality of wirings GL, a plurality of wirings SL, and a plurality of wirings ML. The plurality of pixels 211 are arranged in an array. The plurality of wirings GL, SL, and ML are provided in accordance with the arrangement of the plurality of pixels 211. The wirings GL are arranged in a vertical direction. The wirings SL and ML are arranged in a horizontal direction. The wiring GL is also referred to as a gate line, a scan line, a selection signal line, or the like. The wiring SL is also referred to as a source line, a data line, or the like. The wiring ML is provided to monitor the pixels 211, and can be referred to as a monitor wiring, for example.

The peripheral circuit 220 includes a gate driver circuit 221, a source driver circuit 222, a monitor circuit 223, and an analog-to-digital conversion circuit (ADC) 224.

The gate driver circuit 221 is a circuit for driving the wiring GL and has a function of generating a signal supplied to the wiring GL. The source driver circuit 222 is a circuit for driving the wiring SL and has a function of generating a signal supplied to the wiring SL. The monitor circuit 223 has a function of detecting an analog signal flowing in the wiring ML. The ADC 224 is a circuit for converting an analog signal output from the monitor circuit 223 to a digital signal. The signal CMOUT is an output signal of the ADC 224 and is also a digital signal. The signal CMOUT is input to the image processing circuit 233. Here, the semiconductor device in Embodiment 1 is used for the ADC 224.

The image processing circuit 233 has a function of processing an image signal input from the outside and generating a data signal VDATA. The data signal VDATA is a digital signal that represents a gray scale. Furthermore, the image processing circuit 233 has a function of correcting the data signal VDATA using the signal CMOUT. The source driver circuit 222 has a function of processing the data signal VDATA and generating a data signal supplied to each wiring SL. The memory 234 is provided to store data needed for performing processing in the image processing circuit 233. The signal CMOUT, the data signal VDATA, or a video signal input from the outside is stored in the memory 234, for example.

Figure 6:
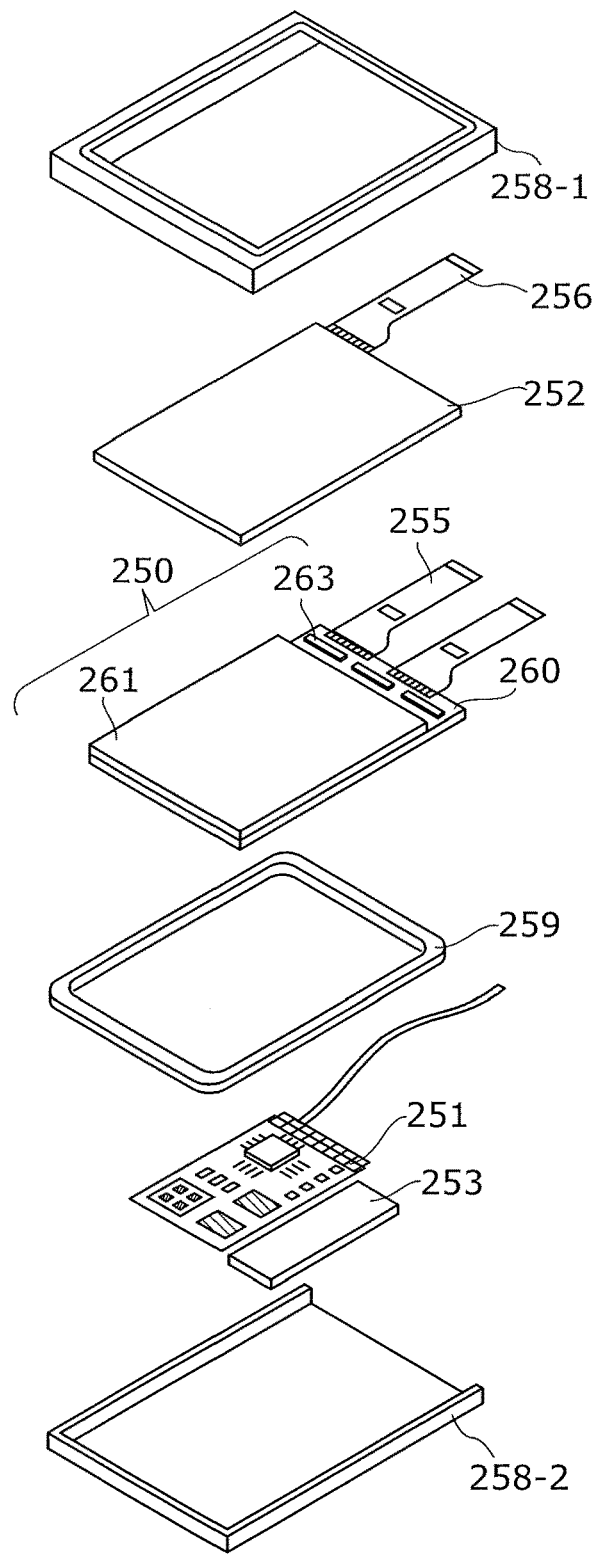
FIG. 6 is an exploded perspective view illustrating a structure example of a display device.

FIG. 6 is an exploded perspective view of the display device 200. The display device 200 includes, between an upper cover 258-1 and a lower cover 258-2, a touch panel unit 252 to which an FPC 256 is connected, a display panel 250 to which an FPC 255 is connected, a frame 259, a printed board 251, and a battery 253. The battery 253, the touch panel unit 252, and the like are not provided in some cases. Furthermore, a backlight unit that illuminates the display panel may be provided as needed.

The shapes and sizes of the upper cover 258-1 and the lower cover 258-2 can be changed as appropriate in accordance with the sizes of the touch panel unit 252 and the display panel 250. The frame 259 protects the display panel 250 and also functions as an electromagnetic shield for blocking electromagnetic waves generated by the operation of the printed board 251. The frame 259 may function as a radiator plate.

The printed board 251 includes the CPU 230, the power supply circuit 232, the image processing circuit 233, and the memory 234. As a power source for supplying electric power to the power supply circuit 232, an external commercial power source or the battery 253 separately provided may be used. The battery 253 can be omitted in the case of using a commercial power source. The display device 200 may be additionally provided with a member such as a polarizing plate, a retardation plate, or a prism sheet.

The touch panel unit 252 can be a resistive touch panel or a capacitive touch panel and can be formed to overlap with the display panel 250. A counter substrate (sealing substrate) of the display panel 250 can have a touch panel function. A photosensor may be provided in each pixel of the display panel 250 to form an optical touch panel. An electrode for a touch sensor may be provided in each pixel of the display panel 250 so that a capacitive touch panel is obtained.

The display panel 250 in FIG. 6 includes a substrate 260 and a substrate (counter substrate) 261. The substrate 260 is provided with the pixel portion 210 and the peripheral circuit 220. The substrate 260 provided with a circuit such as the pixel portion 210 is referred to as an element substrate (backplane) in some cases. Part or all of the peripheral circuit 220 may be provided for the substrate 260 in the same manufacturing process as the pixel portion 210. In the example shown in FIG. 6, part of the peripheral circuit 220 is provided in an IC 263. The IC 263 is mounted on the substrate 260 by a chip on glass (COG) method.

<<Display Panel>>

Figure 7:
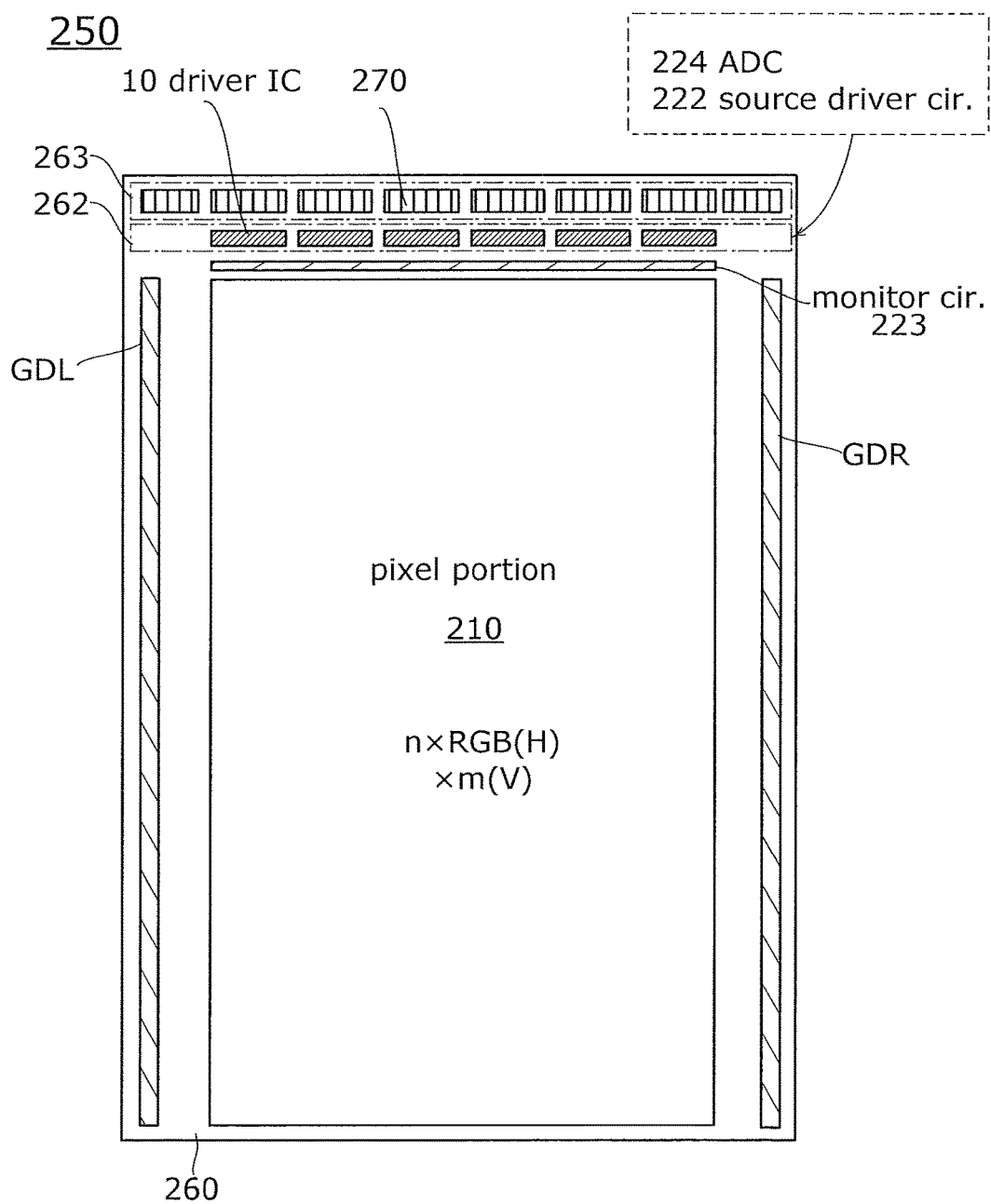
FIG. 7 is a plan view illustrating a structure example of a display panel.

FIG. 7 is a plan view illustrating a structure example of an element substrate of the display panel 250. Here, FIG. 7 is used as a reference of terms showing positions, such as right, left, top, and bottom.

The display panel 250 is provided with the pixel portion 210 and the peripheral circuit 220 (circuits 221 to 224). The gate driver circuit 221 and the monitor circuit 223 of the peripheral circuit are formed over the substrate 260 in the same manufacturing process as the pixel portion 210. The gate driver circuit 221 is divided into two circuits (GDL and GDR), and these circuits are provided on the left and right of the pixel portion 210. For example, the wirings GL in the odd-numbered rows are electrically connected to the GDR, and the wirings GL in the even-numbered rows are electrically connected to the GDL. In this case, the GDL and the GDR drive the wirings GL alternately.

In a region 262, the source driver circuit 222 and the ADC 224 are provided. In the example shown in FIG. 7, the source driver circuit 222 and the ADC 224 include six driver ICs 10. The number of driver ICs 10 is not limited thereto. A plurality of terminals (not illustrated) are formed in the region 262, and the driver ICs 10 are electrically connected to the terminals.

In the following description of the display device 200, the resolution of the pixel portion 210 in the horizontal direction (H) is n×RGB and the resolution in the vertical direction (V) is m. Note that n and M each are an integer of 2 or more. RGB (red, green, and blue) represents colors displayed in the pixels 211. Here, three (RGB) pixels 211 (sub-pixels) form one unit pixel.

The structure of the unit pixel is not limited thereto, and the number of sub-pixels; the light-emitting colors of the sub-pixels, the arrangement of the sub-pixels in the unit pixel, and the like can be set as appropriate. For example, in the case where four sub-pixels form one unit pixel, a combination of colors to be displayed can be red (R), green (G), blue (B), and yellow (Y) or red (R), green (G), blue (B), and white (W). In this specification and the like, in the case where the components are distinguished by colors displayed in the pixel, an identification sign such as "_R", "[R]", or "R[1]" is added. For example, a pixel 211_R represents a red pixel 211. Furthermore, a wiring SL_G[2] represents a wiring SL in the second column electrically connected to the pixel 211_G.

<<Pixel>>

Figure 8A:
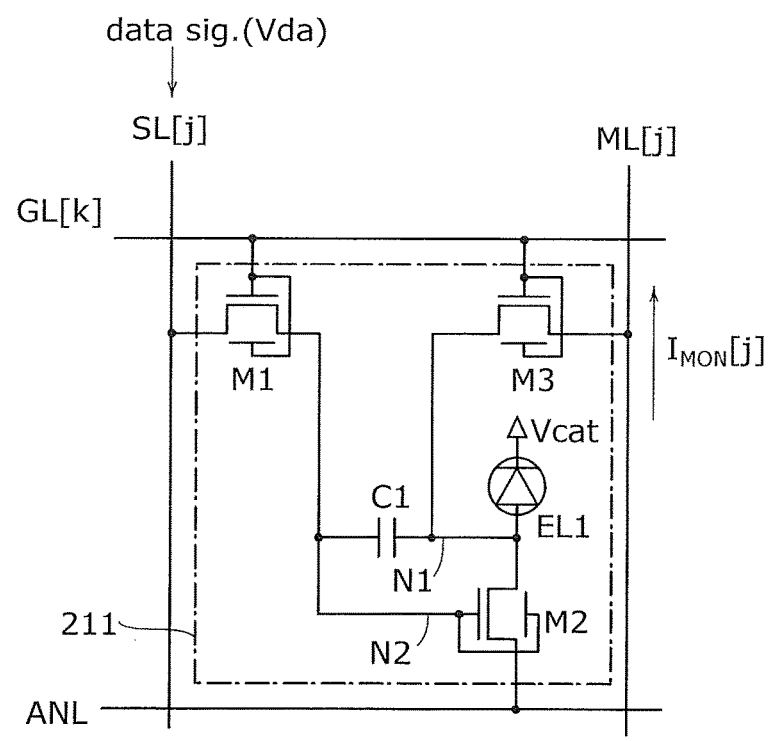
FIG. 8A is a circuit diagram illustrating a configuration example of a pixel.
Figure 8B:
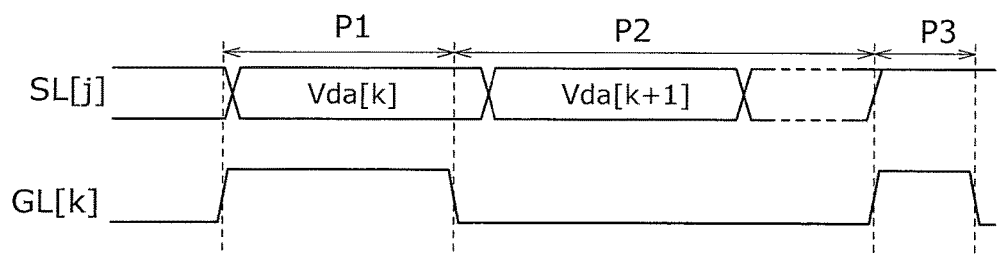
FIG. 8B is a timing chart showing an operation example of the pixel.

FIG. 8A is a circuit diagram showing an example of the pixel 211, and FIG. 8B is a timing chart showing an operation example of the pixel 211 in FIG. 8A.

FIG. 8A shows the pixel 211 arranged in the k-th row and the j-th column (k is an integer of 2 or more and in or less and j is an integer of 2 or more and n or less). The pixel 211 is electrically connected to wirings GL, SL, ML, and ANL. The pixel 211 includes transistors M1, M2, and M3, a capacitor C1, and a light-emitting element EL1.

The light-emitting element EL1 includes a pair of terminals (an anode and a cathode). As the light-emitting element EL1, an element which can control the luminance with current or voltage can be used. Typical examples of the light-emitting element EL1 are a light-emitting diode (LED) and an organic light-emitting diode (OLED). In the case of using an OLED, the light-emitting element EL1 includes an electroluminescent (EL) layer. The EL layer is formed using a single layer or a plurality of layers between the anode and the cathode. The EL layer includes at least a layer containing a light-emitting substance (light-emitting layer). A light-emitting element in which the EL layer is used for light emission is referred to as an EL element in some cases. A display device in which the EL element is used in the pixel is referred to as an EL display device in some cases. In particular, a light-emitting element including an organic EL layer may be referred to as an organic EL element, and a display device including an organic EL element may be referred to as an organic EL display device (OLED). Needless to say, the light-emitting element EL1 can be an organic EL element.

Although the transistors M1 to M3 are n-channel transistors in FIG. 8A, some or all of the transistors may be p-channel transistors. The transistors M1 to M3 each include a back gate electrically connected to a gate. With such a device structure, the current drive capability of the transistors M1 to M3 can be improved. Some or all of the transistors M1 to M3 may be transistors which do not include back gates.

The transistor M1 is a pass transistor which connects a gate of the transistor M2 (a node N2) and the wiring SL. The transistor M3 is a pass transistor which connects the wiring ML and an anode of the light-emitting element EL1 (a node N1). The transistor M2 is a driving transistor and functions as a current source of current supplied to the light-emitting element EL1. In accordance with the amount of drain current of the transistor M2, the luminance of the light-emitting element EL1 is adjusted. The capacitor C1 is a storage capacitor which stores voltage between the node N1 and the node N2.

<Operation Example>

The data signal $V_{da}$ is input to the wiring SL. The voltage value of the data signal $V_{da}$ corresponds to the gray scale of the video signal. In FIG. 8B, $V_{da}[k]$ and $V_{da}[k+1]$ represent the data signals $V_{da}$ input to the k-th pixel 211 and the (k+1)-th pixel 211, respectively.

A period P1 is a writing operation period and the light-emitting element EL1 does not emit light during the period. Voltage $V_{ano}$ is applied to the wiring ANL and voltage $V_{cat}$ is applied to the cathode of the light-emitting element EL1. The wiring ML is electrically connected to a power supply line supplying voltage V0. The wiring GL is set at a high level to turn on the transistors M1 and M3. The voltage of the wiring SL is applied to the node N2, so that the drain current having a value corresponding to the voltage flows in the transistor M2.

Note that the voltage $V_{ano}$, the voltage V0, and the voltage $V_{cat}$ are preferably set so as to satisfy the following formulae (b1), (b2), and (b3). In the following formulae, voltage $V_{thE}$ represents the threshold voltage of the light-emitting element EL1, and voltage $V_{th2}$ represents the threshold voltage of the transistor M2.

$$V0 < V_{cat} + V_{thE} \tag{b1}$$

$$V_{ano} > V0 + V_{thE} \tag{b2}$$

$$V_{ano} > V_{cat} + V_{thE} + V_{th2} \tag{b3}$$

When the formulae (b1) and (b2) are satisfied, by turning on the transistor M3 in the period P1 (writing period), the drain current of the transistor M2 can be preferentially flown in the wiring ML, not in the light-emitting element EL1. When the formula (b3) is satisfied, a potential difference between the wiring ANL and the cathode of the light-emitting element EL1 is generated in a period P2 (light emission period); thus, the drain current of the transistor M2 is supplied to the light-emitting element EL1, and the light-emitting element EL1 can emit light. During the period P2, the transistors M1 and M3 are turned off.

A period P3 is a monitor period in which the drain current of the transistor M2 is obtained. The transistors M1 and M3 are turned on. Furthermore, an electrical connection between the wiring ML and the power supply line supplying the voltage V0 is broken. To the wiring SL, such a voltage that the voltage of the node N2 is higher than the voltage $V_{th2}$ is applied. The voltage $V_{ano}$ is applied to the wiring ANL, and the voltage $V_{cat}$ is applied to the cathode of the light-emitting element EL1. The wiring SL and the like are driven in this manner, whereby the drain current of the transistor M2 can be preferentially flown in the wiring ML, not in the light-emitting element EL1.

Current $I_{MON}$ output from the pixel 211 to the wiring ML in the period P3 corresponds to the drain current flowing in the transistor M2 during the light emission period. The current $I_{MON}$ is analyzed and the voltage of the data signal $V_{da}$ is corrected on the basis of the analyzation result, whereby the deviation of the luminance of the pixel 211 can be corrected.

The monitor operation is not necessarily performed after light-emitting operation. For example, in the pixel 211, the monitor operation can be performed after the cycle of data writing operation and light-emitting operation is repeated plural times. Alternatively, after the monitor operation, the light-emitting element EL1 may be brought into a non-light-emitting state by writing a data signal corresponding to the lowest grayscale level 0 to the pixel 211.

Although an example in which the light-emitting element is used as the display element is shown here, one embodiment of the present invention is not limited thereto. For example, in this specification and the like, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an EL element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, a display element including a carbon nanotube, and the like. A display medium whose contrast, luminance, reflectance, transmittance, or the like is changed by electrical or magnetic action may be included. Examples of display devices including EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink, electronic liquid powder (registered trademark), or electrophoretic elements is electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption. Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor film thereover, such as an n-type GaN semiconductor layer including crystals. Furthermore, a p-type GaN semiconductor layer including crystals or the like can be provided thereover, and thus the LED can be formed. Note that an AlN layer may be provided between the n-type GaN semiconductor layer including crystals and graphene or graphite. The GaN semiconductor layers included in the LED may be formed by a metal organic chemical vapor deposition (MOCVD) method. Note that when the graphene is provided, the GaN semiconductor layers included in the LED can also be formed by a sputtering method.

<<Monitor Circuit>>

Figure 9A:
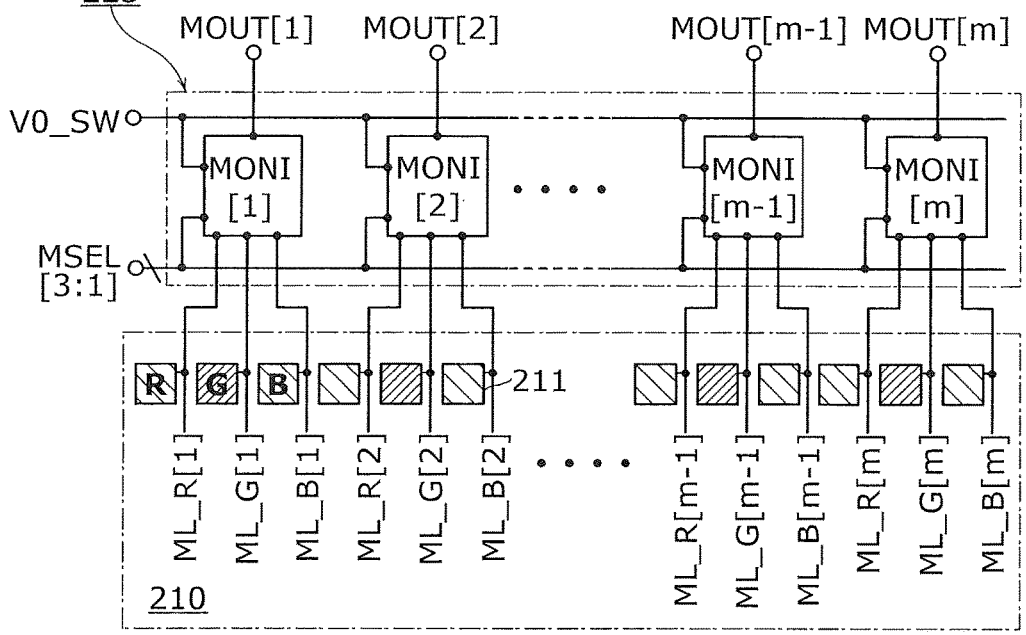
FIGS. 9A and 9B are circuit diagrams illustrating a configuration example of a monitor circuit.
Figure 9B:
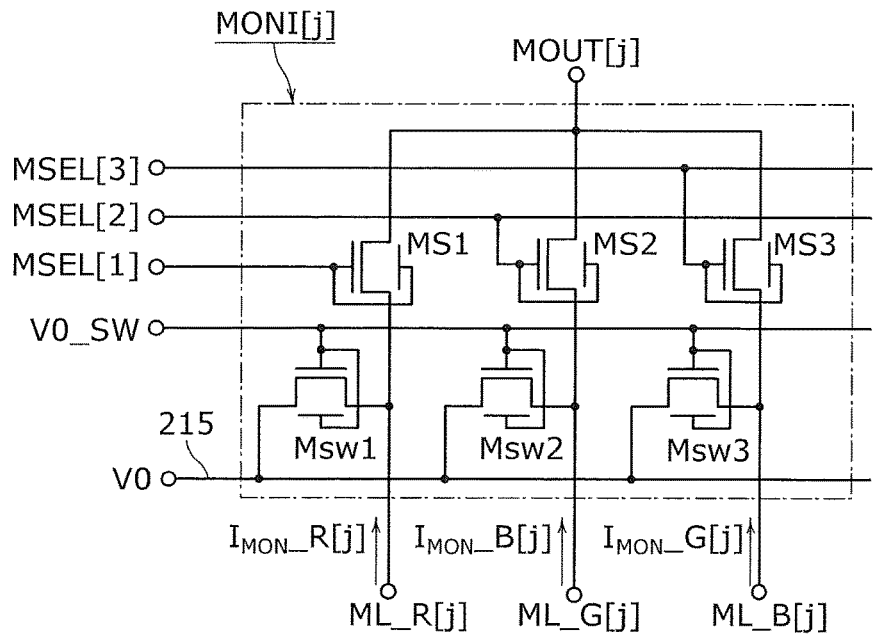

The current $I_{MON}$ is input to the monitor circuit 223. The monitor circuit 223 has a function of controlling the output of the current $I_{MON}$ to the ADC 224. FIG. 9A shows a configuration example of the monitor circuit 223. The monitor circuit 223 is controlled by a signal V0_SW and signals MSEL[3:1] and includes m-stage circuits MONI. FIG. 9B is a circuit diagram showing a configuration example of a circuit MONI[j]. For example, in the case where the resolution of the display panel 250 is 8K4K (4320×RGB (H)× 7680 (V)), the monitor circuit 223 includes 4320 circuits MOM.

The circuit MONI is a three-input one-output circuit. To the input terminals of the circuit MONI, three wirings (ML_R, ML_G, and ML_B) are electrically connected, and the output terminal thereof is a terminal MOUT and is electrically connected to the ADC 224. The circuit MONI includes six transistors (Msw1, Msw2, Msw3, MS1, MS2, and MS3). The transistors Msw1 to Msw3 and MS1 to MS3 each function as a switch. The transistor Msw1 controls electrical continuity between a power supply line 215 and the wiring ML_R, the transistor Msw2 controls electrical continuity between the power supply line 215 and the wiring ML_G, and the transistor Msw3 controls electrical continuity between the power supply line 215 and the wiring ML_B. The transistor MS1 controls electrical continuity between the terminal MOUT and the wiring ML_R, the transistor MS2 controls electrical continuity between the terminal MOUT and the wiring ML_G, and the transistor MS3 controls electrical continuity between the terminal MOUT and the wiring ML_B. The power supply line 215 is a wiring for supplying the voltage V0.

The signal V0_SW is input to the gates of the transistors Msw1 to Msw3. The signals MSEL[1], MSEL[2], and MSEL[3] are input to the gates of the transistors MS1, MS2, and MS3. During the writing period (the period P1 in FIG. 8B) and the light emission period (the period P2 in FIG. 8B), the transistors Msw1 to Msw3 are turned on and the transistors MS1 to MS3 are turned off. During the monitor period (the period P3 in FIG. 8B), the transistors Msw1 to Msw3 are turned off. Any one of the transistors MS1 to MS3 is controlled to be turned on. In the monitor period, current signals $I_{MON}\_R[j]$, $I_{MON}\_G[j]$, and $I_{MON}\_B[j]$ that flow through the wirings ML_R[j], ML_G[j], and ML_B[j] are sequentially output from the teiminal MOUT[j].

Here, although the transistors Msw1 to Msw3 and MS1 to MS3 are n-channel transistors, some or all of the transistors may be p-channel transistors. Furthermore, although the transistors Msw1 to Msw3 and MS1 to MS3 each include a back gate, some or all of the transistors may be transistors which do not include back gates.

<<Gate Driver Circuit (GDR and GDL)>>

The circuits GDR and GDL are each m/2-stage shift registers. The pixel 211 in FIG. 8A and the circuit MONI in FIG. 9B are each a circuit including transistors of a single conductivity type. Thus, the circuits GDR and GDL are preferably formed using only n-channel transistors for cost reduction of the display panel 250 and the like.

<<Driver IC>>

Figure 10:
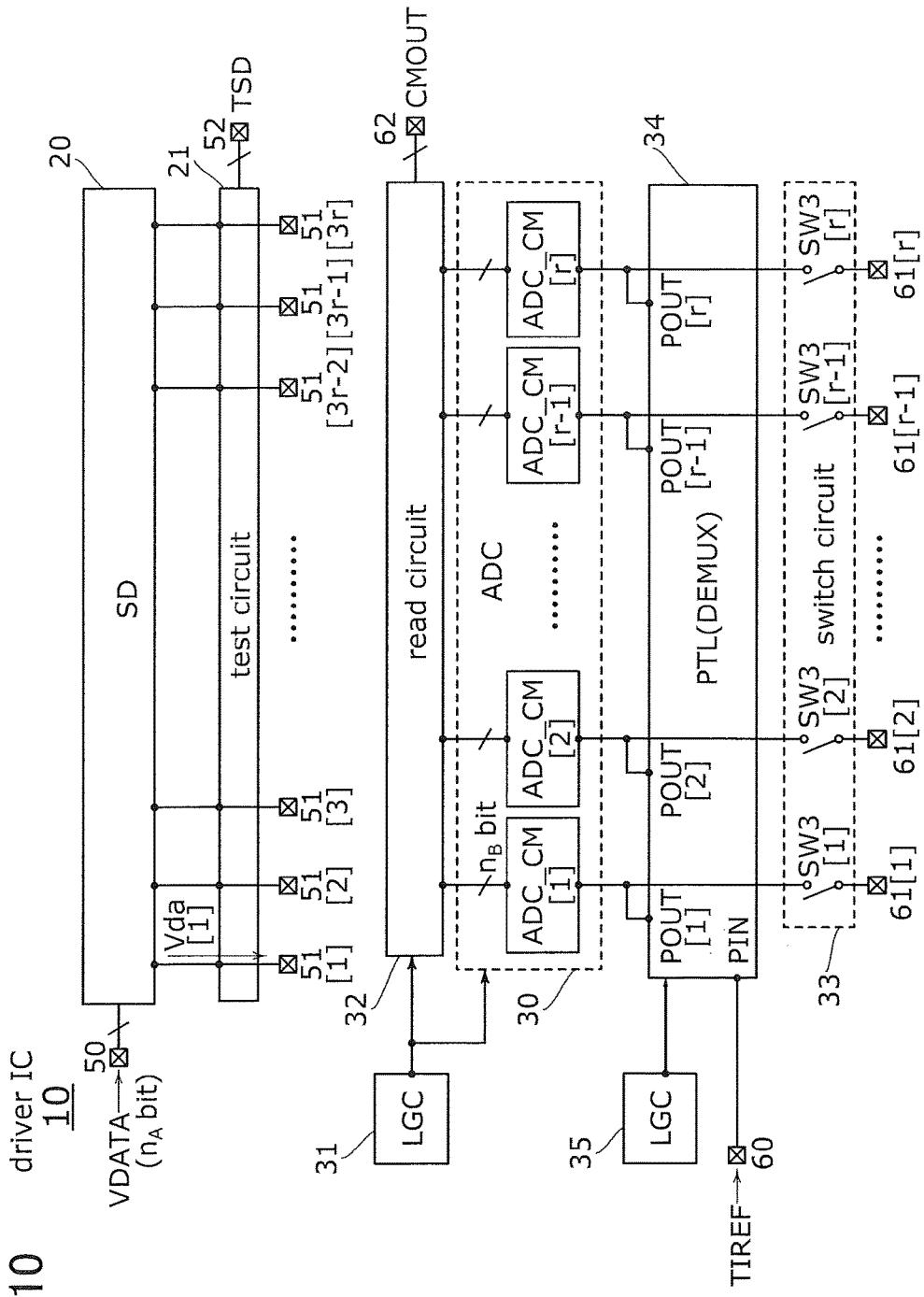
FIG. 10 illustrates a configuration example of a driver IC.

FIG. 10 shows a configuration example of a driver IC. A driver IC 10 shown in FIG. 10 includes a circuit (SD) 20, a test circuit 21, an analog-to-digital conversion circuit (ADC) 30, a logic circuit (LGC) 31, a read circuit 32, a switch circuit 33, a pass transistor logic circuit (PTL) 34, a logic circuit (LGC) 35, a plurality of terminals 50, 3r terminals 51 (r is an integer of 2 or more and n or less), a plurality of terminals 52, a terminal 60, r terminals 61, and a plurality of terminals 62. The terminals 50 are input terminals, and the terminals 51 and 52 are output terminals. The terminals 60 and 61 are input teiminals, and the terminals 62 are output terminals. FIG. 10 shows some of the teiminals of the driver IC 10. Note that even when a terminal is shown as one terminal in FIG. 10 like the terminal 50, the terminal may be a terminal group including a plurality of terminals corresponding to the number of input signals or output signals. The same applies to the other drawings.

<Source Driver Portion>

The SD 20 is a circuit corresponding to the source driver circuit 222 and is electrically connected to 3r terminals 51. FIG. 10 shows an example in which the unit pixel includes three (RGB) pixels 211. In the case where the unit pixel includes four (RGBY) pixels 211, the number of terminals 51 is 4r.

The terminals 51[1] to 51[3r] are electrically connected to the respective wirings SL. The terminal 50 is an input terminal of an $n_A$-bit data signal VDATA. The data signal VDATA is a video signal processed by the image processing circuit 233. The SD 20 processes the data signal VDATA to generate 3r data signals (analog voltage signals) $V_{da}[1]$ to $V_{da}[3r]$. Furthermore, the SD 20 outputs the data signals $V_{da}[1]$ to $V_{da}[3r]$ to the terminals 51[1] to 51[3r] at the timing which is specified by the control circuit 231. Examples of the process performed by the SD 20 are parallel-to-serial conversion, digital-to-analog conversion, and signal amplification. A plurality of kinds of functional circuits are provided in the SD 20 in accordance with the processes.

The test circuit 21 is provided to verify the operation of the SD 20. The test circuit 21 includes a switch circuit which controls electrical continuity between the SD 20 and the terminal 51. During the verification of the SD 20, the test circuit 21 breaks electrical continuity between the SD 20 and the terminals 51[1] to 51[3r]. The SD 20 outputs one or a plurality of data signals $V_{da}$ from the terminal 52 in accordance with the control of the test circuit 21. Here, the output signal from the terminal 52 is referred to as a signal TSD. When the signal TSD output from the terminal 52 is analyzed, the evaluation of defects, the verification of performance, or the like can be performed in the SD 20.

<Current Detection Portion>

The driver IC 10 includes a current detection portion for obtaining a current value of an output signal ($I_{MON}$) from the monitor circuit 223. The semiconductor device 100 of FIG. 1 is used in the current detection portion. The current detection portion includes the ADC 30, the LGC 31, the read circuit 32, the switch circuit 33, the PTL 34, the LGC 35, the terminal 60, the r terminals 61, and the plurality of terminals 62. The terminals 60 and 61 are input terminals, and the terminals 62 are output terminals.

The terminals 61[1] to 61[r] are electrically connected to the respective terminals MOUT (FIGS. 9A and 9B) of the circuits MONI. The ADC 30 is a circuit for converting each of the signals input from the terminals 61[1] to 61[r] into a digital signal, and includes r circuits ADC_CM. The circuit ADC_CM is an analog-to-digital conversion circuit that converts an input signal into an $n_B$-bit digital signal. The LGC 31 is a circuit for generating control signals that control the ADC 30 and the read circuit 32.

The switch circuit 33 has a function of controlling electrical continuity between the ADC_CM[1] to the ADC_CM[r] and the terminal 61[1] to the teiminal 61 [r], respectively. The switch circuit 33 includes r switches SW3. The switch SW3[j] (j is an integer of 1 or more and r or less) controls electrical continuity between the terminal 61[j] and the input terminal of the ADC 30. The switch SW3 may include a transistor, for example. To verify the ADC 30, the analog current signal TIREF is input to the ADC_CM[1] to the ADC_CM[r]. In normal operation, that is, when the display panel 250 displays an image, the current signals $I_{MON}[1]$ to $I_{MON}[r]$ are input to the ADC_CM[1] to the ADC_CM[r] during the monitor period of the pixel 211.

The read circuit 32 is a circuit for reading out the signal of the ADC 30. For example, a shift register is provided in the read circuit 32, and the shift register sequentially outputs control signals to the ADC_CM[1] to the ADC_CM[r] to read out the signal. The plurality of terminals 62 are terminals for the output signal CMOUT from the read circuit 32.

The PTL 34 is a circuit for verifying the operation of the ADC 30. The LGC 35 is a circuit for generating a control signal of the PTL 34. The PTL 34 can function as a DEMUX with r outputs. The PTL 34 can distribute the signal TIREF input from one terminal PIN to r terminals POUT[1] to POUT[r]. The terminal 60 is a terminal for inputting the signal TIREF.

For example, in the case where the six driver ICs 10 are used in the display panel 250 and the resolution is 4K2K (Quad Full HD, 3840×RGB (H)×2160), the number of terminals 61 is 640 and the number of terminals 51 is 1920 (3×640). In the case where the resolution is 8K4K (4320× RGB (H)×7680 (V)), the number of terminals 61 is 720 and the number of terminals 51 is 2160 (3×720).

<PTL>

Figure 11:
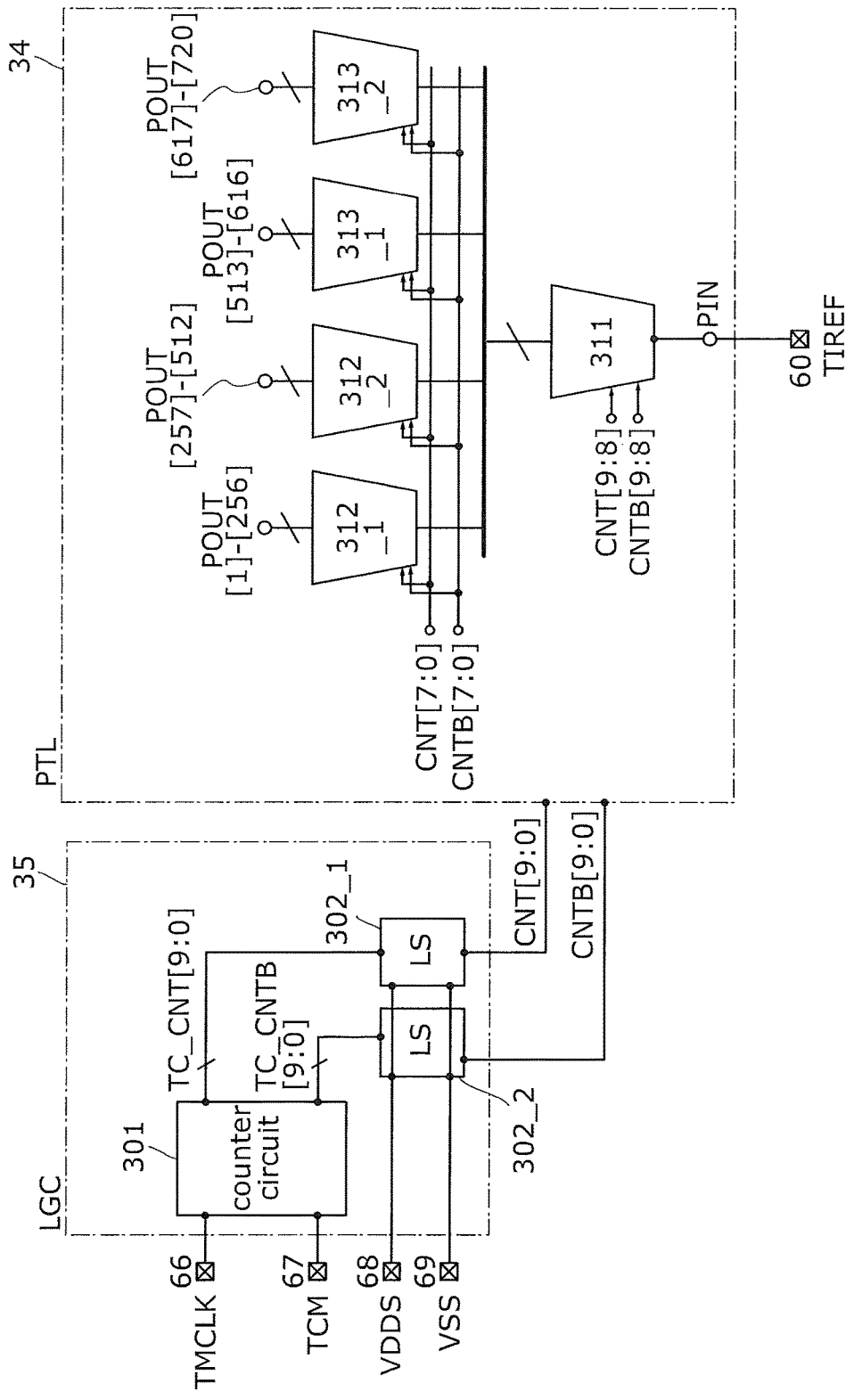
FIG. 11 illustrates a configuration example of a logic circuit (LGC) and PTL.

FIG. 11 shows a configuration example of the PTL 34 and the LGC 35. The LGC 35 has a function of generating a signal that controls electrical continuity between pass transistors in the PTL 34. FIG. 11 shows an example in which the resolution of the pixel portion 210 is 8K4K (4320×RGB (H)×7680 (V)).

The LGC 35 in FIG. 11 includes a counter circuit 301 and two level shift circuits (LS) 302. Terminals 66, 67, 68, and 69 are terminals of the driver IC 10. The terminal 66 is an input terminal for a clock signal TMCLK, and the terminal 67 is an input terminal of the signal TCM. The terminal 68 is an input terminal of a power supply voltage VDDS, and the terminal 69 is an input terminal of a power supply voltage VSS.

The counter circuit 301 has a function of obtaining a 10-digit count value in binary. The number of digits of the count value of the counter circuit 301 can be determined in accordance with the configuration of the PTL 34. The counter circuit 301 counts rising (or falling) of the signal TMCLK. The counter circuit 301 outputs signals TC_CNT[9:0] representing the count value and the inverted signals TC_CNTB[9:0]. The signal TCM is a signal for resetting the count value. For example, when the signal TCM is set at a high level, the count value becomes 1023 ($2^{10}-1$) and the signals TC_CNT[9:0] are set at a high level.

Here, the reset operation of the counter circuit 301 and the switching operation of the switch SW3 in the switch circuit 33 are synchronized with each other. Thus, the signal TCM is input to the switch circuit 33 directly or through a level shifter (LS). The switch SW3 is controlled to be on or off by the signal TCM.

The LS 302-1 shifts the level of the signals TC_CNT[9:0] to generate signals CNT[9:0]. The LS 302-2 shifts the level of the signals TC_CNTB[9:0] to generate signals CNTB[9:0]. The signals CNT[9:0] and CNTB[9:0] are input to the PTL 34. The pass transistors in the PTL 34 are controlled to be on or off by the signals CNT[9:0] and CNTB[9:0].

The PTL 34 can have a circuit configuration similar to that of the PTL 132 (FIG. 3 and FIG. 4), in which a plurality of n-channel pass transistors or a plurality of p-channel pass transistors are connected to each other so as to form a binary tree structure. The PTL 34 in FIG. 11 includes one DEMUX 311, two DEMUXes 312, and two DEMUXes 313. To the DEMUX 311, the high-order 2 bits of each of the signals CNT and CNTB are input, and to the DEMUXes 312 and 313, the low-order 7 bits of each of the signals CNT and CNTB are input.

The DEMUX 311 is a 4-output circuit. The DEMUX 312 is a 256-output circuit, and the DEMUX 313 is a 104-output circuit. A DEMUX 312_1 is electrically connected to terminals POUT[1] to POUT[256], and a DEMUX 312_2 is electrically connected to terminals POUT[257] to POUT[512]. A DEMUX 313_1 is electrically connected to terminals POUT[513] to POUT[616], and a DEMUX 313_2 is electrically connected to terminals POUT[617] to POUT[720].

Figure 12:
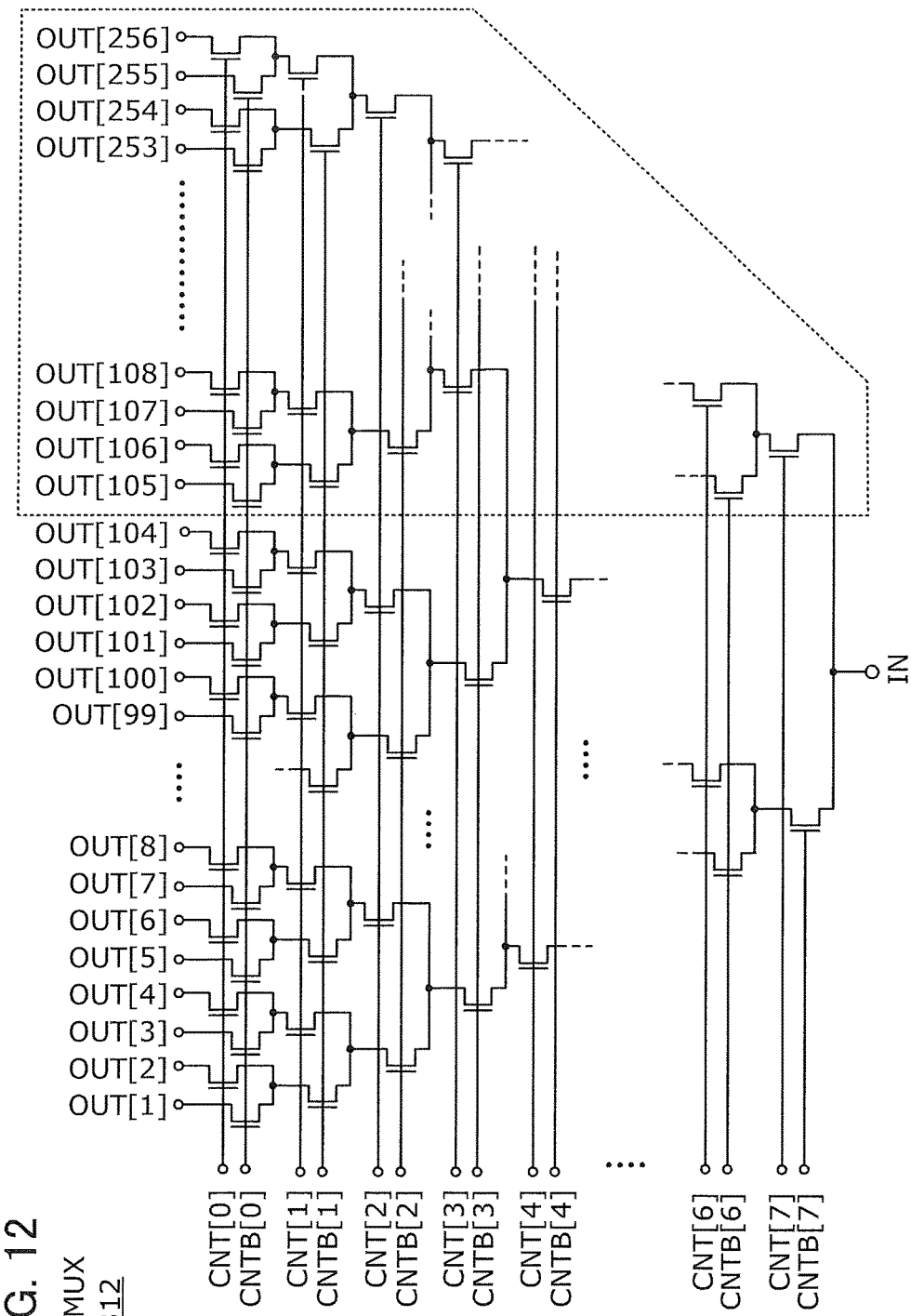
FIG. 12 is a circuit diagram illustrating a configuration example of a demultiplexer (DEMUX)

FIG. 12 shows a configuration example of the DEMUX 312. In FIG. 12, pass transistors are n-channel transistors. A circuit in FIG. 12 from which pass transistors surrounded by dotted lines are removed corresponds to the DEMUX 313.

The counter circuit 301 generates a count value in accordance with the configuration of the PTL 34. In the example of FIG. 11, the counter circuit 301 counts 0 to 615, and then counts from 768 to 871. When the count value is 615, the terminal POUT[616] is selected. When the count value is 768, the terminal POUT[617] is selected, and when the count value is 871, the terminal POUT[720] is selected. Furthermore, when the counter circuit 301 is reset so that the count value is 1023, a signal path is not formed in the PTL 34; thus, any of the terminals POUT is not electrically connected to the terminal PIN. In the case where the signal $I_{MON}$ is input from the pixel portion 210 to the ADC 30, the count value of the counter circuit 301 is reset.

<ADC and Read Circuit>

Figure 13:
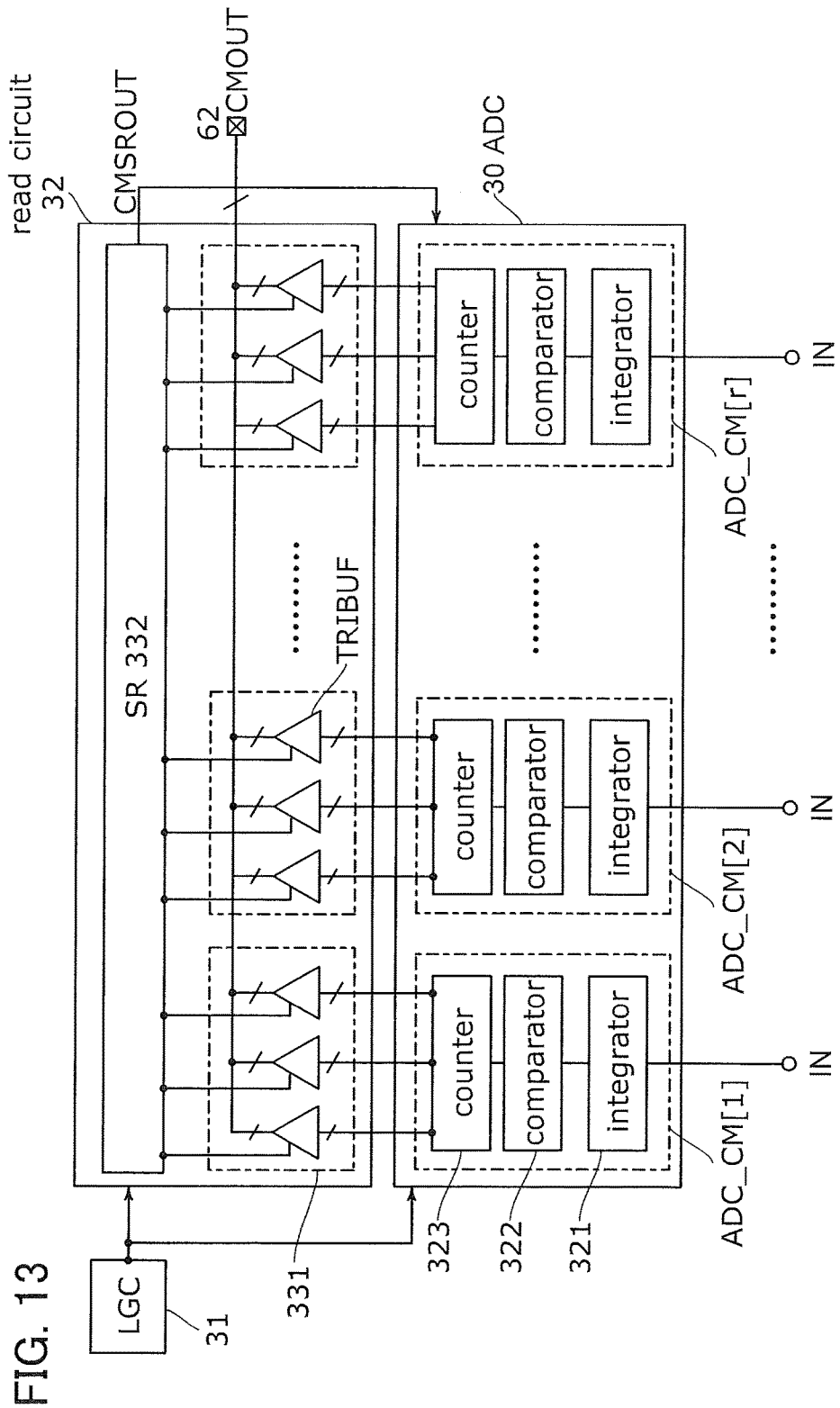
FIG. 13 illustrates a configuration example of an analog-to-digital conversion circuit and a read circuit.

FIG. 13 shows a configuration example of the ADC 30 and the read circuit 32. The ADC_CM includes an integrator circuit 321, a comparator 322, and a counter circuit 323. In order to control the ADC 30, signals are input from the outside of the driver IC 10, the LGC 31, and a shift register (SR) 332. For example, to the ADC 30, a signal CMSROUT from the last stage of the SR 332 is input.

The read circuit 32 includes r circuits 331 and the SR 332. The circuit 331[*j*] has a function of controlling output of a signal from the ADC_CM[j] to the terminal 62. The circuit 331 can include one or a plurality of three-state buffer circuits (TRIBUF), for example. The SR 332 has a function of generating a control signal of the circuit 331. Here, the SR 332 generates an enable signal of the TRIBUF. The SR 332 selects one of the plurality of TRIBUFs, and connects the selected TRIBUF and the terminal 62 to bring the output of the TRIBUF into a high impedance state.

<ADC_CM>

Figure 14:
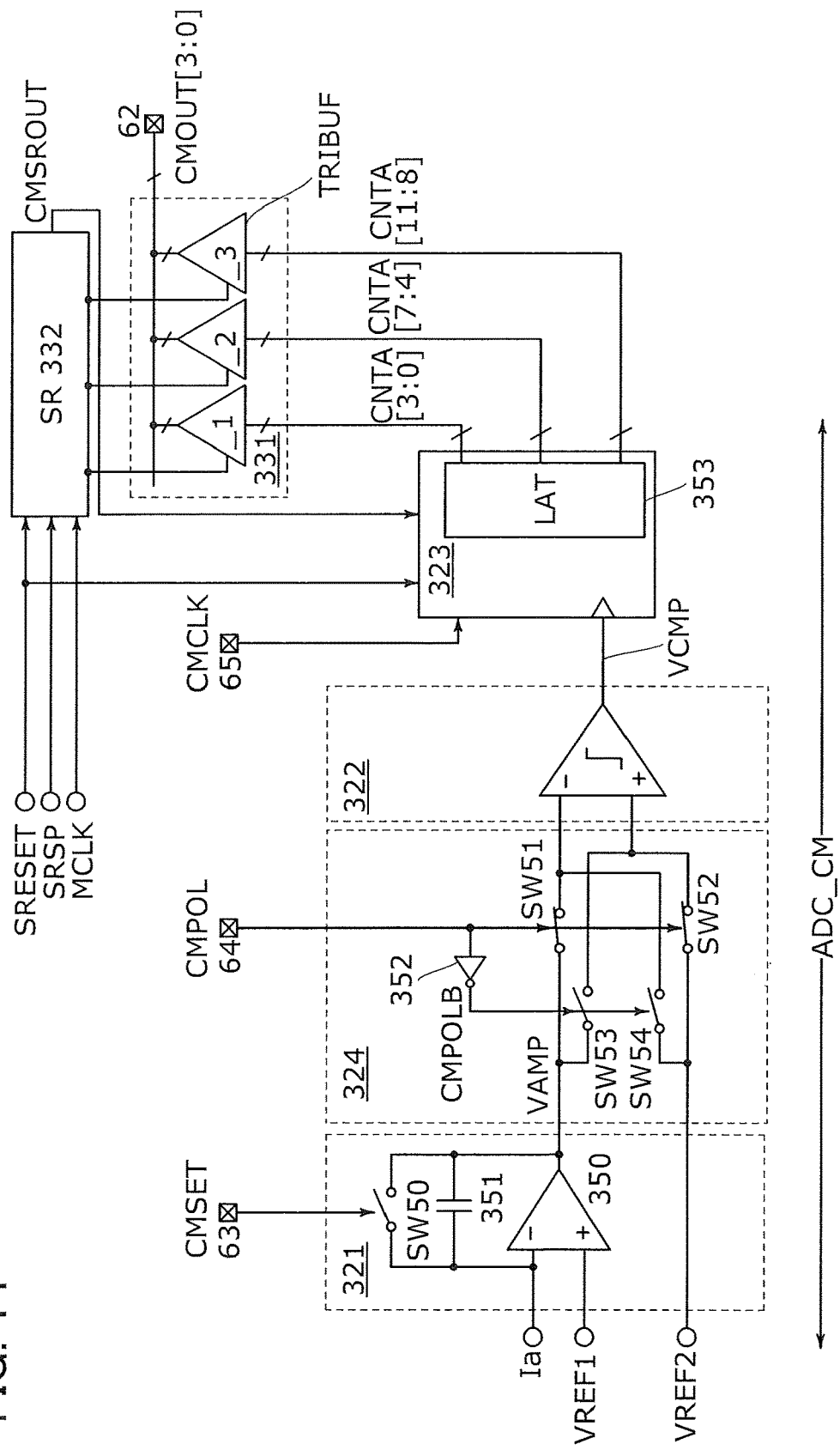
FIG. 14 illustrates a configuration example of a circuit ADC_CM and a read circuit.

FIG. 14 shows a configuration example of the ADC_CM and the read circuit 32. The ADC_CM in FIG. 14 includes the integrator circuit 321, the comparator 322, the counter circuit 323, and a circuit 324. The ADC_CM has functions of detecting the value of a signal Ia and generating a digital signal representing the value of the signal Ia. In other words, the ADC_CM is a current integrating ADC and has a function of converting an analog current signal into a digital signal. The signal Ia is an analog current signal TIREF during the verification, and is the output signal $I_{MON}$ of the circuit MONI during normal operation.

The integrator circuit 321 includes an operational amplifier 350, a capacitor 351, and a switch SW50. In the operational amplifier 350, the signal Ia is input to an inverting input terminal (terminal (−)) and a reference voltage VREF1 is input to a non-inverting input terminal (terminal (+)). The switch SW50 is controlled by a signal CMSET. The signal CMSET is a set signal and has a function of setting the voltage of the output terminal of the operational amplifier 350 at an initial value. In this example, by set operation, the voltage of the output terminal of the operational amplifier 350 is set to the voltage VREF1. The signal CMSET is input from a terminal 63 of the driver IC 10.

The comparator 322 has a function of comparing an output signal VAMP of the operational amplifier 350 with a reference voltage VREF2. In the example of FIG. 14, as the comparator 322, a hysteresis comparator is used. When the voltage of the input signal of the terminal (+) becomes higher than the voltage of the input signal of the terminal (−), a signal VCMP becomes a high level. The voltages VREF1 and VREF2 are generated in a power supply generation circuit inside the driver IC 10. Here, the voltage VREF1 is higher than the voltage VREF2.

The circuit 324 includes switches SW51 to SW54 and an inverter 352. The switches SW51 and SW52 are controlled by the signal CMPOL, and the switches SW53 and SW54 are controlled by the signal CMPOLB. By the circuit 324, the inputs to the terminals (+) and (−) of the comparator 322 are switched between the signal VAMP and the voltage VREF2. That is, the circuit 324 has a function of switching the operation mode of the ADC_CM between a current sinking mode and a current source mode. The signal CMPOL is a signal for setting a mode and is input from a terminal 64 of the driver IC 10. The inverted signal CMPOLB of the signal CMPOL is generated by the inverter 352.

The counter circuit 323 has a function of generating digital data representing the current value of the signal Ia. The counter circuit 323 includes a latch circuit (LAT) 353. To the counter circuit 323, a clock signal CMCLK, the signal VCMP, a signal SRESET, and the signal CMSROUT are input. The clock signal CMCLK is input to a terminal 65 of the driver IC 10. The signal SRESET is generated in the LGC 35 and also input to the SR 332. The counter circuit 323 has a function of counting the number of rises (or falls) of the signal CMCLK. The LAT 353 is a circuit for holding a count value. The signal VCMP has a function of stopping the count operation of the counter circuit 323. For example, when the signal VCMP changes from a low level to a high level, the counter circuit 323 stops data rewriting in the LAT 353. Thus, the count value held in the LAT 353 is set. The signal SRESET is a signal for resetting the count value of the LAT 353. The signal CMSROUT is a signal for outputting the count value from the LAT 353. The LAT 353 outputs a digital signal CNTA representing a count value. FIG. 14 shows an example in which the counter circuit 323 has a function of obtaining a 12-digit count value in binary.

<Operation Example of ADC_CM>

Figure 15:
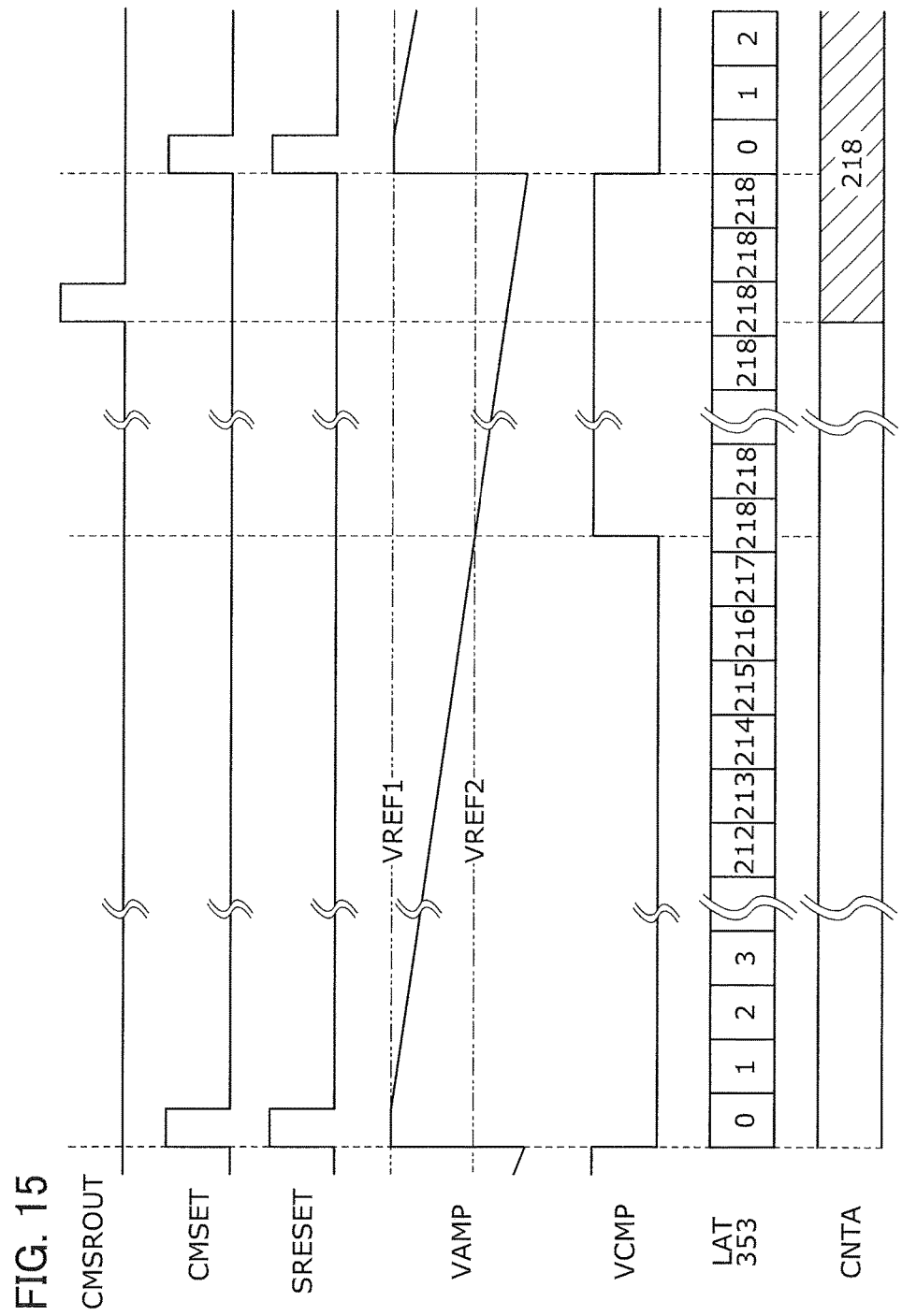
FIG. 15 is a timing chart showing an operation example of a circuit ADC_CM.

FIG. 15 is a timing chart showing an operation example of the ADC_CM. In the operation example of FIG. 15, the voltage VREF2 is input to the terminal (+) of the comparator 322 and the signal VAMP is input to the terminal (−).

The ADC_CM is reset by the signals CMSET and SRESET. Furthermore, the SR 332 is also reset by the signal SRESET. The voltage of the signal VAMP becomes the voltage VREF1, and the count value held in the LAT 353 becomes 0. The counter circuit 323 counts the number of rises of the signal CMCLK, and the count value of the LAT 353 is increased one by one. When the signal CMSET becomes a low level and the switch SW50 is turned off, the voltage of the signal VAMP is decreased from the voltage VREF1 due to the signal Ia. After that, when the voltage of the signal VAMP becomes lower than the voltage VREF2, the signal VCMP becomes a high level. The counter circuit 323 stops updating of the count value of the LAT 353 by an input of the high-level signal VCMP to set the count value. The set count value represents the current amount of the signal Ia. Here, the count value is set to 218. The counter circuit 323 outputs the signal CNTA with a count value of "218" by an input of a high-level signal CMSROUT.

<Circuit 331>

The signal CNTA is distributed by one bit or a plurality of bits in accordance with the number of TRIBUFs of the circuit 331, and is input to the TRIBUFs. In the example of FIG. 14, the circuit 331 includes three TRIBUFs; thus, the signals CNTA[11:0] are separated by four bits and input to the circuit 331. The signals CNTA[3:0] are input to a TRIBUF_1, the signals CNTA[7:4] are input to a TRIBUF_2, and the signals CNTA[11:8] are input to a TRIBUF_3.

The SR 332 generates an enable signal of the TRIBUF in accordance with signals (such as SRESET, SRSP, and MCLK). The signal SRESET is a reset signal of the SR 332. The signal SRSP is a start pule signal. The signal MCLK is a clock signal.

In the circuit 331, enable signals are sequentially input to the TRIBUF_1, the TRIBUF_2, and the TRIBUF_3, and the signals CNTA[3:0], CNTA[7:4], and CNTA[11:8] are output from the ADC_CM to the terminal 62 in this order. That is, in the example of FIG. 14, the circuit 331 reads out the signals CNTA[11:0] by four bits. The read signals are output from the terminal 62. The four-bit signals CMOUT[3:0] are output signals of the terminal 62.

The signal CMOUT is input to the image processing circuit 233. The image processing circuit 233 analyzes the signal CMOUT and corrects the data signal VDATA. The current signal $I_{MON}$ used for correcting the data signal VDATA is a weak signal of, for example, approximately 110 pA to 10 nA. Thus, the current signal TIREF used for verifying the ADC 30 is required to be a current value approximately equivalent to that of the signal $I_{MON}$.

In this embodiment, the PTL 34 can include transistors having a much small number of stages than the number of circuits (ADC_CM) to be verified. Thus, the circuit size of the test circuit can be reduced, so that the driver IC 10 can be small. Furthermore, a variation in the signal TIREF due to leakage current of the pass transistors in the PTL 34 can be inhibited. For example, in the example of FIG. 11, to verify 780 ADC_CMs, the PTL 34 including 10-stage pass transistors is provided. When the PTL 34 is used for a test circuit as described above, a large number of circuits can be verified by a test circuit whose size is small, and the verification with a few errors can be performed. In particular, for reducing verification errors, it is effective to provide PTL in a test circuit to verify a functional circuit processing a current signal of approximately 1 nA to 10 nA. As the number of circuits to be verified is increased, the effect of reducing leakage current due to the PTL 34 becomes significant. The number of circuits to be verified can be greater than or equal to $2^k$ (e.g., k is greater than or equal to 8 and less than or equal to 19), for example. Furthermore, the upper limit of the number of the circuits is greater than $2^k$, and can be approximately $1 \times 10^4$, $1 \times 10^6$, or $1 \times 10^7$.

<<Display Panel>>

Figure 16:
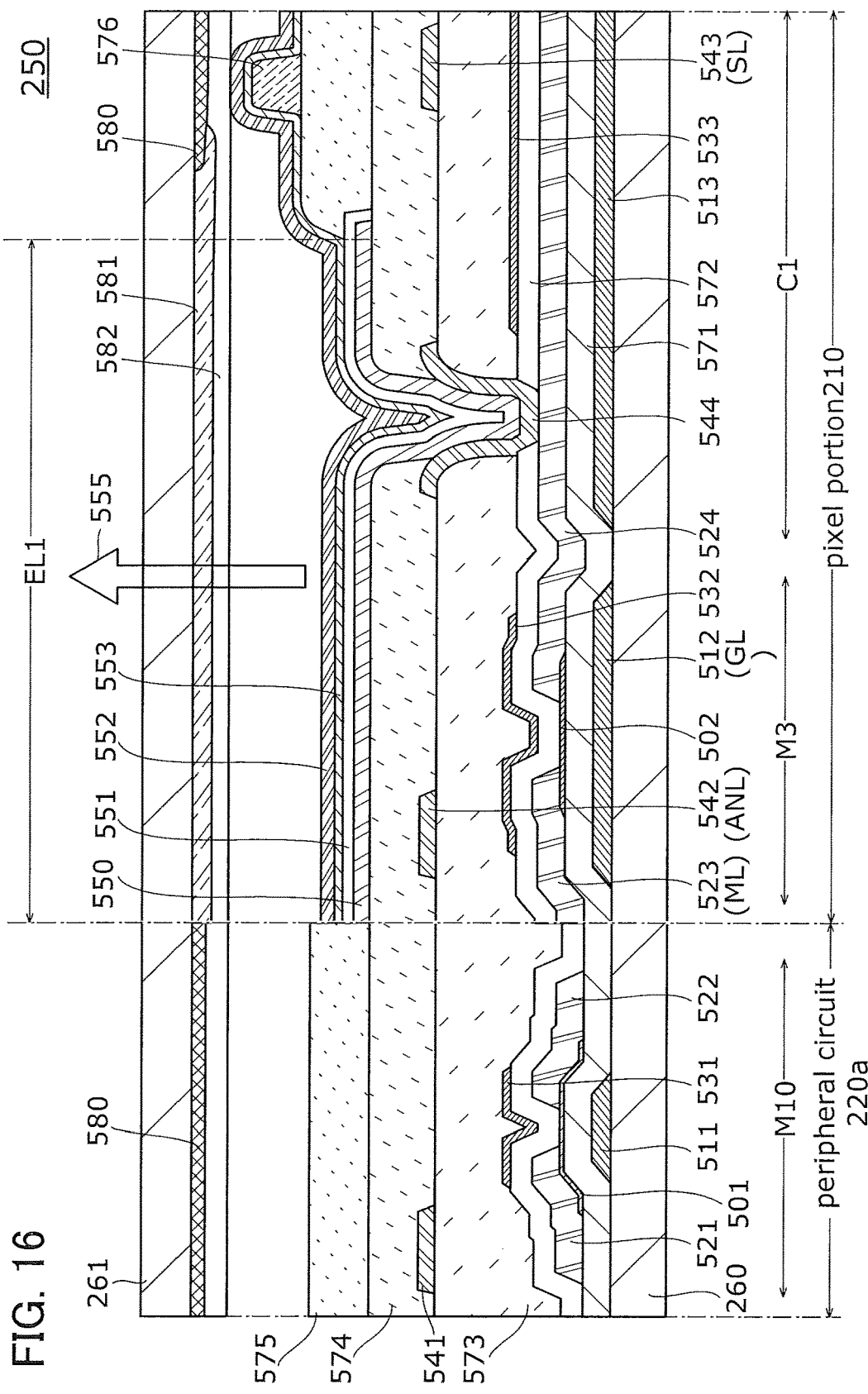
FIG. 16 is a cross-sectional view illustrating a structure example of a display panel.

FIG. 16 shows an example of a device structure of the display panel 250. FIG. 16 illustrates a stacked-layer structure of the display panel 250. Note that FIG. 16 is a diagram for illustrating device structures of the pixel portion 210 and a peripheral circuit 220a (the GDR, the GDL, and the monitor circuit 223 in the example of FIG. 7) formed together with the pixel portion 210, and is not a cross-sectional view of a specific portion of the display panel 250. In FIG. 16, the display panel 250 has a top-emission structure in which light 555 emitted from the light-emitting element EL1 is extracted from the substrate 261 side.

There is no particular limitation on a device structure of a transistor, a capacitor, and the like provided on the substrate 260. A device structure suitable for each function of the pixel portion 210 and the peripheral circuit 220a can be selected. As the device structure of the transistor, for example, a top-gate type, a bottom-gate type, a dual-gate type provided with both a gate (front gate) and a bottom gate, and a multi-gate type including a plurality of gate electrodes for one semiconductor layer are given. There is also no particular limitation on a semiconductor layer in which a channel of the transistor is formed. A semiconductor included in the semiconductor layer is roughly divided into a single crystal semiconductor and a non-single-crystal semiconductor. As the non-single-crystal semiconductor, a polycrystalline semiconductor, a microcrystalline semiconductor, an amorphous semiconductor, and the like are given. As a semiconductor material, a Group 14 semiconductor including one kind or a plurality of kinds of Group 14 elements such as Si, Ge, and C (e.g., silicon, silicon germanium, or silicon carbide), an oxide semiconductor (e.g., an In—Ga—Zn oxide or an In—Sn—Zn oxide), a compound semiconductor, and the like are given.

Here, as an example of the display panel 250, an example in which the element substrate is formed with transistors having the same conductivity type is described. In the example, the transistors of the element substrate are transistors in which channels are formed in oxide semiconductor layers (hereinafter referred to as OS transistors in some cases). FIG. 16 illustrates the transistor M3, the capacitor C1, the light-emitting element EL1, and a transistor M10 in the peripheral circuit 220a. The transistors M3 and M10 each have a dual-gate structure in which a gate electrode is provided on the substrate 260 side.

<Element Substrate>

The element substrate of the display panel 250 is formed in such a manner that an oxide semiconductor (OS) layer, a plurality of insulating layers, a plurality of conductive layers, and the like are stacked over the substrate 260.

The conductive layers of the display panel 250 can be formed with a single-layer conductive fihn or two or more conductive films. As such conductive films, metal films of aluminum, chromium, copper, silver, gold, platinum, tantalum, nickel, titanium, molybdenum, tungsten, hafnium, vanadium, niobium, manganese, magnesium, zirconium, beryllium, and the like can be used. Furthermore, an alloy film and a compound film containing these metals as components, a polycrystalline silicon film containing an impurity element such as phosphorus, a silicide film, and the like can be used. Furthermore, as the conductive film included in the element substrate, a light-transmitting conductive film can be used. As the light-transmitting conductive film, a film containing a metal oxide such as indium oxide containing tungsten oxide, indium zinc oxide containing tungsten oxide, indium oxide containing titanium oxide, indium tin oxide containing titanium oxide, indium tin oxide (referred to as ITO), indium zinc oxide, or indium tin oxide to which silicon oxide is added can be given.

The insulating layers of the display panel 250 can be formed with a single-layer insulating film or two or more insulating films. As an inorganic insulating film, films formed of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be given. Furthermore, as a resin film, a resin film of an acrylic resin, a polyimide resin, a benzocyclobutene-based resin, a siloxane-based resin, a polyamide resin, an epoxy resin, or the like can be given. Note that in this specification, an oxynitride refers to a compound that contains more oxygen than nitrogen, and a nitride oxide refers to a compound that contains more nitrogen than oxygen.

The element substrate of the display panel in FIG. 16 includes oxide semiconductor (OS) layers 501 and 502, conductive layers 511 to 513 provided in a first conductive layer, conductive layers 521 to 524 provided in a second conductive layer, conductive layers 531 to 533 provided in a third conductive layer, conductive layers 541 to 544 provided in a fourth conductive layer, a conductive layer 550 provided in a fifth conductive layer, a conductive layer 551 provided in a sixth conductive layer, a conductive layer 552 provided in a seventh conductive layer, an EL layer 553, and insulating layers 571 to 576. The insulating layer 571 serves as gate insulating layers of the transistors M3 and M10 and a dielectric of the capacitor C1. The insulating layer 572 serves as a dielectric of the capacitor C1. The insulating layer 576 functions as a spacer that maintains a gap between the substrate 260 and the substrate 261.

<GDR and GDL>

The transistor M10 includes the OS layer 501 and the conductive layers 511, 521, 522, and 531. The conductive layer 531 serves as a back gate and is electrically connected to the conductive layer 511. The conductive layer 541 serves as an electrode or a wiring for electrically connecting elements that is provided in the GDR and the GDL.

<Pixel Portion>

The transistor M3 includes the OS layer 502 and conductive layers 512, 523, 524, and 532. The conductive layer 532 serves as a back gate and is electrically connected to the conductive layer 512. The conductive layer 512 serves as a wiring GL and the conductive layer 523 serves as a wiring ML. The conductive layer 524 is shared by the transistor M3 and the capacitor C1. In the example of FIG. 16, the conductive layer 512 can function as a light-blocking layer of the transistor M3. The entire under surface of the OS layer 502 overlaps the conductive layer 512 with the insulating layer 571 provided therebetween. The capacitor C1 is an MIM type, and includes stacked layers of the conductive layer 513, the insulating layer 571, the conductive layer 524, the insulating layer 572, and the conductive layer 533. The conductive layer 542 serves as a wiring ANL, the conductive layer 543 serves as a wiring SL, the conductive layer 544 serves as an electrode for electrically connecting the light-emitting element EL1 to the transistor M3 and the capacitor C1.

The light-emitting element EL1 is provided over the insulating layer 574. A portion in which the conductive layers 550 to 552 and the EL layer 553 are stacked functions as the light-emitting element EL1. The conductive layers 550 and 551 serve as an anode electrode and a cathode electrode of the light-emitting element EL1. The conductive layers 550 and 551 are provided in each of the pixels 211. At least one conductive layer 552 and at least one EL layer 553 are provided in the pixel portion 210.

The EL layer 553 is formed using at least a light-emitting material in which holes and electrons can be recombined to cause light emission. In the EL layer 553, a functional layer such as a hole-injection layer, a hole-transport layer, an electron-transport layer, or an electron-injection layer may be formed as needed. Here, the EL layer 553 that emits white light is provided. The conductive layer 551 is provided in order that the light-emitting element EL1 has a microcavity structure. For example, the conductive layer 551 can be formed using an indium tin oxide film containing silicon oxide. An optical path between the conductive layer 550 and the conductive layer 552 is adjusted by the conductive layer 551. The thickness of the conductive layer 551 is adjusted in accordance with the wavelength of light extracted from the pixel 211. For example, the thickness of the conductive layer 551 may be adjusted within the range of 5 nm to 100 nm. As the wavelength of the light 555 is increased, the thickness of the conductive layer 551 is made larger. Thus, the relationship of the thickness of the conductive layer 551 between pixels 211_R, 211_G, and 211_B becomes the pixel 211_R>the pixel 211_G>the pixel 211_B.

<Structure Example of Counter Substrate>

The counter substrate is fixed with a sealant (not shown) to face the substrate 260. The counter substrate of the display panel 250 in FIG. 16 includes the substrate 261, a light-blocking layer 580, a color filter layer 581, and an overcoat layer 582. The color filter layer 581 is colored a color corresponding to the pixel 211. The color filter layer 581 may be provided on the element substrate or omitted. The peripheral circuit 220a is shielded from light by the light-blocking layer 580. In the pixel portion 210, the light-blocking layer 580 is provided to shield a region that does not contribute to display from light. The overcoat layer 582 has functions of planarizing the surface of the counter substrate and preventing diffusion of impurities (such as water and/or oxygen). The overcoat layer 582 can be formed using, for example, a polyimide resin, an epoxy resin, an acrylic resin, or the like.

(Substrate)

Examples of the substrates 260 and 261 include a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base film. As an example of a glass substrate, a barium borosilicate glass substrate, an aluminoborosilicate glass substrate, a soda lime glass substrate, or the like can be given. Examples of a flexible substrate include a flexible synthetic resin such as plastics typified by polyethylene terephthalate (PET), polyethylene naphthalate (PEN), and polyether sulfone (PES), and acrylic. A film made of polypropylene, polyester, polyvinyl fluoride, polyvinyl chloride, or the like, an inorganic vapor deposition film, or the like can be used as an attachment film. Examples of a base film include base films formed using polyester, polyamide, polyimide, aramid, epoxy, an inorganic vapor deposition film, and paper. Note that in the example of FIG. 16, the substrate 261 transmits the light 555 (visible light).

The substrate 260 is not necessarily a supporting substrate (such as a glass substrate) used for manufacturing the pixel portion 210 and the peripheral circuit 220a. After the pixel portion 210 and the peripheral circuit 220a are formed or in the formation steps of the pixel portion 210 and the peripheral circuit 220a, a supporting substrate may be separated, and a flexible substrate may be attached with an adhesive layer. Furthermore, similarly, the substrate 261 is not necessarily a supporting substrate (such as a glass substrate) used for manufacturing the color filter layers 581 and the like, and after formation of the overcoat layer 582, a supporting substrate may be separated, and a flexible substrate may be attached with an adhesive layer.

When a flexible substrate is used as each of the substrates 260 and 261, a flexible display device can be obtained. Furthermore, when the flexible display device is incorporated, a flexible semiconductor device can be obtained.

(Embodiment 3)

In this embodiment, a transistor which is used in a semiconductor device is described.

<<Transistor Structure Example 1>>

FIGS. 17A to 17D illustrate structure examples of an OS transistor. FIGS. 17A and 17B are top views (layouts) of transistors TA1 and TA2, respectively. FIG. 17C is a cross-sectional view of the transistors TA1 and TA2 taken along the lines x1-x2, and FIG. 17D is a cross-sectional view of the transistors TA1 and TA2 taken along the lines y1-y2. In other words, FIG. 17C is a cross-sectional view in the channel length direction of the transistors TA1 and TA2, and FIG. 17D is a cross-sectional view in the channel width direction of the transistors TA1 and TA2.

Note that for clarity of the device structures, a wiring for supplying a signal or potential to a gate, a source, and a drain of each transistor is not shown in FIGS. 17A to 17D. Furthermore, in the examples of FIGS. 17A to 17D, the channel length corresponds to the distance between a source electrode and a drain electrode, and the channel width corresponds to the length of the source electrode or the drain electrode in a region where an oxide semiconductor layer and a gate electrode overlap with each other. The channel lengths of the transistors TA1 and TA2 are represented by La1 and La2, respectively, and the channel widths of the transistors TA1 and TA2 are represented by Wa1 and Wa2, respectively.

The transistors TA1 and TA2 are provided on the same insulating surface (the substrate 600). The transistors TA1 and TA2 can be manufactured through the same process. The transistors TA1 and TA2 each include a gate and a back gate, and the back gate is connected to the gate. Note that the back gate is not necessarily provided in each of the transistors TA1 and TA2.

<Transistor TA1>

The transistor TA1 is formed over the substrate 600 and includes an electrode GE1, an electrode SE1, an electrode DE1, an electrode BGE1, and a layer OS1. The electrode GE1 is a gate electrode, the electrode SE1 is a source electrode, the electrode DE1 is a drain electrode, and the electrode BGE1 is a back gate electrode. The layer OS1 is an oxide semiconductor layer.

The layer OS1 overlaps with the electrode GE1 with an insulating layer 621 provided therebetween. The pair of electrodes (SE1, DE1) is formed in contact with the top surface and the side surfaces of the layer OS1. As illustrated in FIG. 17A, the layer OS1 includes a region overlapping with neither the electrode GE1 nor the pair of electrodes (SE1, DE1). In the layer OS1, the length in the channel length direction is longer than the channel length La1, and the length in the channel width direction is longer than the channel width Wa1.

An insulating layer 622 and an insulating layer 623 are formed to cover the layer OS1, the electrode GE1, the electrode SE1, and the electrode DE1. The electrode BGE1 is formed over the insulating layer 623. The electrode BGE1 is provided to overlap with the layer OS1 and the electrode GE1. Here, the electrode BGE1 is provided so as to have the same shape as the electrode GE1 and be located in the same position. The electrode BGE1 is in contact with the electrode GE1 through an opening CG1 which penetrates the insulating layers 621 to 623.

As illustrated in FIG. 17D, the transistor TA1 has a device structure in which a channel region is surrounded by the electrode GE1 and the electrode BGE1. Accordingly, the channel region of the transistor TA1 is influenced by an electric field formed by not only the electrode GE1 but also the electrode BGE1. Therefore, when the electrode BGE1 is connected to the electrode GE1, the on-state current of the transistor TA1 can be increased. In addition, the field-effect mobility of the transistor TA1 can be improved. Furthermore, variation in electrical characteristics such as the threshold voltage of the transistor TA1 can be inhibited. Moreover, the strength of the transistor TA1 can be improved by providing the electrode BGE1. Against deformation of the substrate 600 like bending, the electrode BGE1 serves as a reinforcement member to prevent the transistor TA1 from being broken.

The layer OS1 including a channel region has a multilayer structure; here, a three-layer structure formed of three oxide semiconductor films (631, 632, and 633) is employed as an example. The oxide semiconductor used for the layer OS1 is preferably metal oxide containing at least one common metal element, more preferably containing In. As metal oxide containing In which can be used for the semiconductor layer of the transistor, an In—Ga oxide and an In-M-Zn oxide (M is Al, Ga, Y, Zr, La, Ce, or Nd) are typical examples. Furthermore, a material obtained by adding another element or material to such metal oxide can be used.

The oxide semiconductor film 632 is a film in which a channel region of the transistor TA1 is formed. In addition, the oxide semiconductor film 633 serves as a channel region of the transistors TA2, which is described later. Accordingly, the atomic ratio of metal elements that are main components of the oxide semiconductor films 631 to 633 is preferably adjusted so that a channel is formed in the oxide semiconductor film 632 in the transistor TA1 and in the oxide semiconductor film 633 in the transistor TA2.

Since a channel is formed in the oxide semiconductor film 632 in the transistor TA1, the channel region is not in contact with the insulating layer 621 and the insulating layer 622. Furthermore, when the oxide semiconductor films 631 to 633 are metal oxide films containing at least one common metal element, interface scattering is unlikely to occur at the interface between the oxide semiconductor film 632 and the oxide semiconductor film 631 and the interface between the oxide semiconductor film 632 and the oxide semiconductor fihn 633. Thus, the field-effect mobility of the transistor TA1 can be thus higher than that of the transistor TA2, and in addition, the on-state current can be increased.

<Transistor TA2>

The transistor TA2 is a variation of the transistor TA1 and is different from the transistor TA1 in that the layer OS2 is a single-layer structure formed of the oxide semiconductor film 633, and other points are the same. Here, a channel length La2 and a channel width Wa2 of the transistor TA2 are set equal to the channel length La1 and the channel width Wa1 of the transistor TA1, respectively. The transistor TA2 includes an electrode GE2, an electrode SE2, an electrode DE2, an electrode BGE2, and a layer OS2. The electrode BGE2 is in contact with the electrode GE2 through an opening GC2 penetrating the insulating layers 621 to 623. The electrode GE2 is a gate electrode, the electrode SE2 is a source electrode, the electrode DE2 is a drain electrode, and the electrode BGE2 is a back gate electrode. The layer OS2 is an oxide semiconductor layer.

[Insulating Layer]

The insulating layers 621 to 623 are formed over the entire regions where the transistors TA1 and TA2 are formed. The insulating layers 621 to 623 each are formed of a single or plurality of films. The insulating layer 621 serves as a gate insulating layer of the transistors TA1 and TA2. The insulating layers 622 and 623 serve as gate insulating layers of the transistors TA1 and TA2 on the backchannel side. Furthermore, the insulating layer 623, which is the uppermost film, is preferably formed using a material that can function as a protective film of the transistor formed over the substrate 600. The insulating layer 623 may be provided as appropriate. In order to insulate the electrode BGE1 in the third layer from the electrodes SE1 and DE1 in the second layer, at least one insulating film is formed therebetween.

[Oxide Semiconductor Film]

In the case where the semiconductor layer is multilayer like the layer OS1, the oxide semiconductor films forming the multilayer semiconductor layer preferably contains at least one common metal element, more preferably contains In.

When the oxide semiconductor film 631 is an In—Ga oxide film, for example, the atomic proportion of In is set smaller than the atomic proportion of Ga. When the oxide semiconductor film 631 is an In-M-Zn oxide film (M is Al, Ga, Y, Zr, La, Ce, or Nd), the atomic proportion of In is set smaller than the atomic proportion of M, and the atomic proportion of Zn can be the largest among the three.

When the oxide semiconductor film 632 is an In—Ga oxide film, for example, the atomic proportion of In is set larger than the atomic proportion of Ga. When the oxide semiconductor film 632 is an In-M-Zn oxide film, the atomic proportion of In is set larger than the atomic proportion of M, and the atomic proportion of In is preferably larger than the atomic proportions of M and Zn.

When the oxide semiconductor film 633 is an In—Ga oxide film, for example, the atomic proportion of In is set equal to or smaller than the atomic proportion of Ga. When the oxide semiconductor film 633 is an In-M-Zn oxide film, the atomic proportion of In is set equal to the atomic proportion of M, and the atomic proportion of Zn can be larger than the atomic proportions of In and M. Here, the oxide semiconductor film 633 is also a film including a channel region of the transistor TA2.

When the oxide semiconductor films 631 to 633 are formed by sputtering, the atomic proportions of the films can be adjusted by adjusting the atomic proportions or the like of the target compositions. When the oxide semiconductor films 631 to 633 are formed by CVD, the atomic proportions of the films can be adjusted by adjusting the flow rates of source gases or the like. A deposition target for forming In-M-Zn oxide films by sputtering as the oxide semiconductor fihns 631 to 633 will be described below as an example.

When the atomic ratio of metal elements of a target for the oxide semiconductor film 631 is In:M:Zn=$x_1$:$y_1$:$z_1$, $x_1/y_1$ is preferably greater than or equal to ⅙ and less than 1; $z_1/y_1$ is preferably greater than or equal to ⅓ and less than or equal to 6, further preferably greater than or equal to 1 and less than or equal to 6.

Typical examples of the atomic ratio of the metal elements in the target are In:M:Zn=1:3:2, In:M:Zn=1:3:4, In:M:Zn=1:3:6, In:M:Zn=1:3:8, In:M:Zn=1:4:4, In:M:Zn=1:4:5, In:MZn=1:4:6, In:MZn=1:4:7, In:M:Zn=1:4:8, In:M:Zn=1:5:5, In:M:Zn=1:5:6, In:M:Zn=1:5:7, In:M:Zn=1:5:8, and In:M:Zn=1:6:8.

When the atomic ratio of metal elements of a target for the oxide semiconductor film 632 is In:M:Zn=$x_2$:$y_2$:$z_2$, $x_2/y_2$ is preferably greater than 1 and less than or equal to 6; $z_2/y_2$ is preferably greater than 1 and less than or equal to 6. Typical examples of the atomic ratio of the metal elements in the target are In:M:Zn=2:1:1.5, In:MZn=2:1:2.3, In:M:Zn=2:1:3, In:M:Zn=3:1:2, In:M:Zn=3:1:3, and In:M:Zn=3:1:4.

When the atomic ratio of metal elements of a target for the oxide semiconductor film 633 is In:MZn=$x_3$:$y_3$:$z_3$, $x_3/y_3$ is preferably greater than or equal to ⅙ and less than or equal to 1; $z_3/y_3$ is preferably greater than or equal to ⅓ and less than or equal to 6, further preferably greater than or equal to 1 and less than or equal to 6. Typical examples of the atomic ratio of the metal elements in the target are In:M:Zn=1:1:1, In:M:Zn=1:1:1.2, In:M:Zn=1:3:2, In:M:Zn=1:3:4, In:MZn=1:3:6, In:M:Zn=1:3:8, In:M:Zn=1:4:4, In:M:Zn=1:4:5, In:MZn=1:4:6, In:M:Zn=1:4:7, In:MZn=1:4:8, In:M:Zn=1:5:5, In:M:Zn=1:5:6, In:M:Zn=1:5:7, In:M:Zn=1:5:8, and In:M:Zn=1:6:8.

Oxide semiconductor films with low carrier density are used as the oxide semiconductor films 631 to 633. For example, oxide semiconductor films each having a carrier density which is $1\times10^{17}/cm^3$ or lower, preferably $1\times10^{15}/cm^3$ or lower, further preferably $1\times10^{13}/cm^3$ or lower, and still further preferably $1\times10^{11}/cm^3$ or lower are used as the oxide semiconductor films 631 to 633.

Note that it is preferable to use, as the oxide semiconductor films 631 to 633, oxide semiconductor films in which the impurity concentration is low and density of defect states is low, in which case the transistor can have more excellent electrical characteristics. Here, the state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor film has few carrier generation sources, and thus has a low carrier density in some cases. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Furthermore, the highly purified intrinsic or substantially highly purified intrinsic oxide semiconductor film provides an extremely low off-state current; even when an element has a channel width of $1 \times 10^6$ μm and a channel length (L) of 10 μm, the off-state current can be less than or equal to the measurement limit of a semiconductor parameter analyzer, i.e., less than or equal to $1 \times 10^{-13}$ A, at a voltage (drain voltage) between a source electrode and a drain electrode of from 1 V to 10 V. Thus, the transistor in which a channel region is formed in the oxide semiconductor film has a small variation in electrical characteristics and high reliability. As examples of the impurities, hydrogen, nitrogen, alkali metal, and alkaline earth metal are given.

Hydrogen contained in the oxide semiconductor film reacts with oxygen bonded to a metal atom to be water, and in addition, an oxygen vacancy is formed in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally on.

It is thus preferable that hydrogen be reduced as much as possible as well as the oxygen vacancies in the oxide semiconductor films 631 to 633. Specifically, in each of the oxide semiconductor films 631 to 633, the concentration of hydrogen which is measured by secondary ion mass spectrometry (SIMS) is set to be lower than or equal to $5 \times 10^{19}$ atoms/cm$^3$, preferably lower than or equal to $1 \times 10^{19}$ atoms/cm$^3$, further preferably lower than $5 \times 10^{18}$ atoms/cm$^3$, still further preferably lower than or equal to $1 \times 10^{18}$ atoms/cm$^3$, yet still further preferably lower than or equal to $5 \times 10^{17}$ atoms/cm$^3$, yet still furthermore preferably lower than or equal to $1 \times 10^{16}$ atoms/cm$^3$.

When the oxide semiconductor films 631 to 633 contain silicon or carbon, which is an element belonging to Group 14, oxygen vacancies in the films are increased, so that the films become n-type. For this reason, the concentration of silicon or carbon (the concentration is measured by SIMS) of each of the oxide semiconductor films 631 to 633 is set to be lower than or equal to $2 \times 10^{18}$ atoms/cm$^3$, preferably lower than or equal to $2 \times 10^{17}$ atoms/cm$^3$.

The concentration of alkali metal or alkaline earth metal in each of the oxide semiconductor films 631 to 633, which is measured by SIMS, is set to be lower than or equal to $1 \times 10^{18}$ atoms/cm$^3$, preferably lower than or equal to $2 \times 10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of each of the oxide semiconductor films 631 to 633.

When containing nitrogen, the oxide semiconductor films 631 to 633 easily become n-type by generation of electrons serving as carriers and an increase of carrier density. Thus, a transistor including an oxide semiconductor which contains nitrogen is likely to be normally on, and the content of nitrogen in the oxide semiconductor films 631 to 633 is preferably reduced as much as possible. For example, the nitrogen concentration which is measured by SIMS is preferably set to be, for example, lower than or equal to $5 \times 10^{18}$ atoms/cm$^3$.

Without limitation to the oxide semiconductor films 631 to 633 described above, other oxide semiconductor films with appropriate compositions can be used depending on required electrical characteristics (e.g., field-effect mobility and threshold voltage). To obtain the required electrical characteristics, it is preferable that the carrier density, the impurity concentration, the defect density, the atomic ratio of a metal element to oxygen, the interatomic distance, the density, and the like of each of the oxide semiconductor films 631 to 633 be set to appropriate values.

The structures of transistors are not limited to those of the transistors TA1 and TA2 described above, and the structure of the transistor can be changed depending on the required semiconductor characteristics and electrical characteristics of the transistor. For example, the presence or absence of a back gate electrode, a stacked-layer structure of an oxide semiconductor layer, the shapes and positions of an oxide semiconductor layer, a gate electrode, and source and drain electrodes, and the like can be appropriately changed.

<<Transistor Structure Example 2>>

Figure 18A:
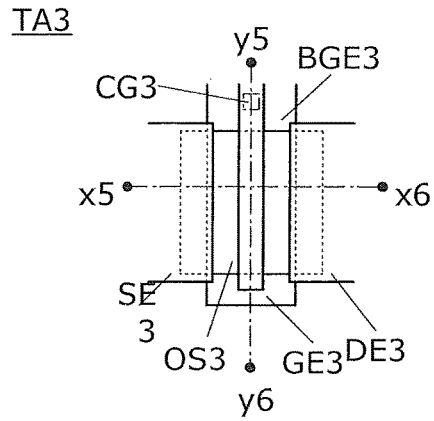
FIGS. 18A to 18D illustrate structure examples of transistors.
Figure 18B:
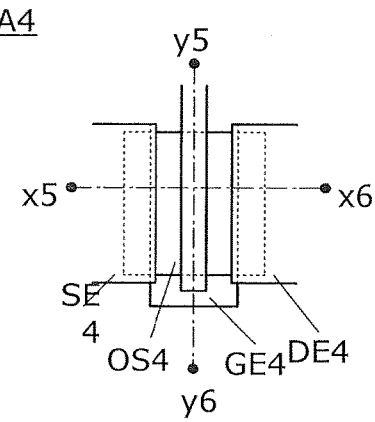
Figure 18C:
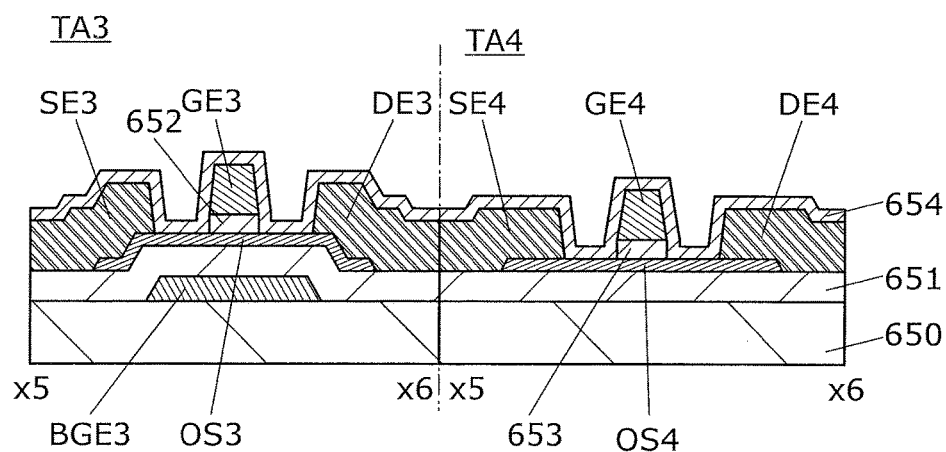
Figure 18D:
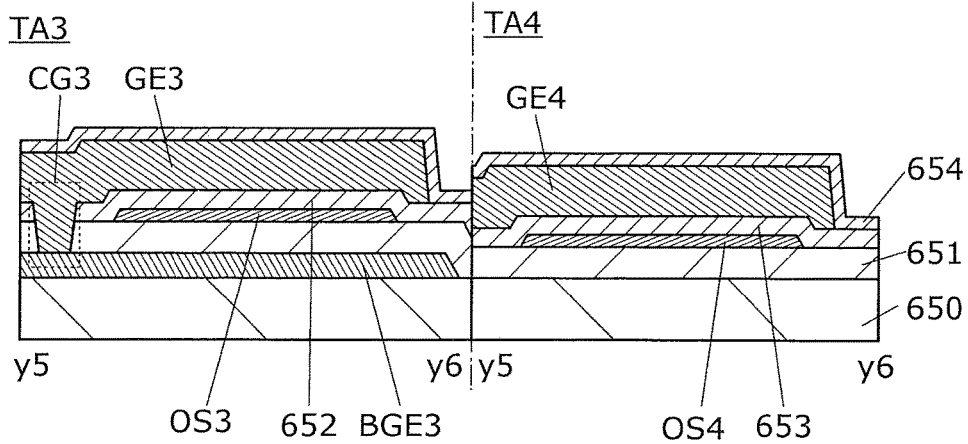

FIGS. 18A to 18D illustrate examples of a structure of a top-gate OS transistor. FIGS. 18A and 18B are top views (layouts) of transistors TA3 and TA4, respectively. FIG. 18C is a cross-sectional view of the transistors TA3 and TA4 taken along the lines x5-x6, and shows a cross-sectional structure in a channel length direction. FIG. 18D is a cross-sectional view of the transistors TA3 and TA4 taken along the lines y5-y6, and shows a cross-sectional structure in a channel width direction.

The transistors TA3 and TA4 are formed over a substrate 650. The transistor TA3 includes an electrode BGE3, a layer OS3 over an insulating layer 651, an electrode SE3, an electrode DE3, an insulating layer 652, and an electrode GE3. The transistor TA4 includes a layer OS4, an electrode SE4, an electrode DE4, an insulating layer 653, and an electrode GE4. Note that the transistors TA3 and TA4 are covered with an insulating layer 654. The insulating layer 653 and the insulating layer 652 each function as a gate insulating film. The electrodes GE3 and GE4 are gate electrodes, the electrodes SE3 and SE4 are source electrodes, the electrodes DE3 and DE4 are drain electrodes, and the electrode BGE3 is a back gate electrode. The layers OS3 and OS4 are oxide semiconductor layers, and each are foimed using a single-layer oxide semiconductor film or a stacked-layer film of oxide semiconductor films.

In an opening CG3, the electrode GE3 is in contact with the electrode BGE3. By applying the same potentials to the electrode GE3 and the electrode BGE3, an on-state current can be increased, variations in the initial characteristics can be reduced, and degradation of the transistor TA3 due to the −GBT stress test and a change in the rising voltage of the on-state current at different drain voltages can be suppressed. On the other hand, by applying different potentials to the electrode GE3 and the electrode BGE3 without connection therebetween, the threshold voltage of the transistor TA3 can be controlled.

In the transistor TA4 and the transistor TA3, the electrode GE4, and the electrode SE4 and the electrode DE4 do not overlap with each other, whereby parasitic capacitance between the electrode GE4, and the electrode SE4 and the electrode DE4 can be reduced. In addition, the electrode GE3, and the electrode SE3 and the electrode DE3 do not overlap with each other, whereby parasitic capacitance between the electrode GE3, and the electrode SE3 and the electrode DE3 can be reduced. As a result, in the case where a large-sized substrate is used as the substrate 650, signal delay in the electrodes SE4, DE4, GE4, SE3, DE3, and GE3 can be reduced.

In the transistor TA3, an impurity element is added to the layer OS3 using the electrode SE3, the electrode DE3, and the electrode GE3 as masks, whereby a region including oxygen vacancies is formed. In the transistor TA4, a rare gas element is added to the layer OS4 using the electrode SE4, the electrode DE4, and the electrode GE4 as masks, whereby a region including oxygen vacancies is formed. In the case where the insulating layer 654 is formed using an insulating film containing hydrogen, since the region including oxygen vacancies is in contact with the insulating layer 654 containing hydrogen in the transistors TA3 and TA4, hydrogen contained in the insulating layer 654 is diffused to the region including oxygen vacancies to form a low-resistance region. That is, the low-resistance region can be formed in a self-aligned manner.

<<Oxide Semiconductor Structure>>

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and a microcrystalline oxide semiconductor.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly includes the case where the angle is greater than or equal to 85° and less than or equal to 95°. The term "substantially perpendicular" indicates that the angle formed between two straight lines is greater than or equal to 60° and less than or equal to 120°. Furthermore, trigonal and rhombohedral crystal systems are included in a hexagonal crystal system.

<CAAC-OS>

A CAAC-OS is one of oxide semiconductors having a plurality of c-axis aligned crystal parts (also referred to as pellets). A CAAC-OS can be referred to as an oxide semiconductor including c-axis aligned nanocrystals (CANC).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°. In structural analysis of the CAAC-OS by an in-plane method in which an X-ray beam is incident on a sample in a direction substantially perpendicular to the c-axis, a peak appears when 2θ is around 56°. Accordingly, the structural analysis using XRD shows that the directions of a-axes and b-axes are irregularly oriented in the CAAC-OS.

Furthermore, electron diffraction indicates that pellets included in the CAAC-OS have c-axis alignment and that the c-axes are aligned in a direction substantially perpendicular to the formation surface or the top surface of the CAAC-OS.

The CAAC-OS is an oxide semiconductor having a low density of defect states. Defects in the oxide semiconductor are, for example, a defect due to impurity and oxygen vacancies. Therefore, the CAAC-OS can be regarded as an oxide semiconductor with a low impurity concentration, or an oxide semiconductor having a small number of oxygen vacancies.

The impurity contained in the oxide semiconductor might serve as a carrier trap or serve as a carrier generation source. Furthermore, oxygen vacancies in the oxide semiconductor serve as carrier traps or serve as carrier generation sources when hydrogen is captured therein.

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

An oxide semiconductor having a low density of defect states (a small number of oxygen vacancies) can have a low carrier density. Such an oxide semiconductor is referred to as a highly purified intrinsic or substantially highly purified intrinsic oxide semiconductor. A CAAC-OS has a low impurity concentration and a low density of defect states. That is, a CAAC-OS is likely to be a highly purified intrinsic or substantially highly purified intrinsic oxide semiconductor. Thus, a transistor including a CAAC-OS rarely has negative threshold voltage (is rarely normally on). The highly purified intrinsic or substantially highly purified intrinsic oxide semiconductor has few carrier traps. An electric charge trapped by the carrier traps in the oxide semiconductor takes a long time to be released. The trapped electric charge may behave like a fixed electric charge. Thus, the transistor which includes the oxide semiconductor having a high impurity concentration and a high density of defect states might have unstable electrical characteristics. However, a transistor including a CAAC-OS has small variation in electrical characteristics and high reliability. Since the CAAC-OS has a low density of defect states, carriers generated by light irradiation or the like are less likely to be trapped in defect states. Therefore, in a transistor using the CAAC-OS, change in electrical characteristics due to irradiation with visible light or ultraviolet light is small.

<Microcrystalline Oxide Semiconductor>

A microcrystalline oxide semiconductor has a region in which a crystal part is observed and a region in which a crystal part is not clearly observed in a high-resolution TEM image. In most cases, the size of a crystal part included in the microcrystalline oxide semiconductor is greater than or equal to 1 mu and less than or equal to 100 nm, or greater than or equal to 1 mn and less than or equal to 10 nm. An oxide semiconductor including a nanocrystal (nc) that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 mn, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an amorphous oxide semiconductor. Note that there is no regularity of crystal orientation between different pellets in the nc-OS. Therefore, the nc-OS has a higher density of defect states than the CAAC-OS.

<<Transistor Structure Example 3>>

Here, an example in which a semiconductor layer is formed using a silicon film is shown.

Figure 19:
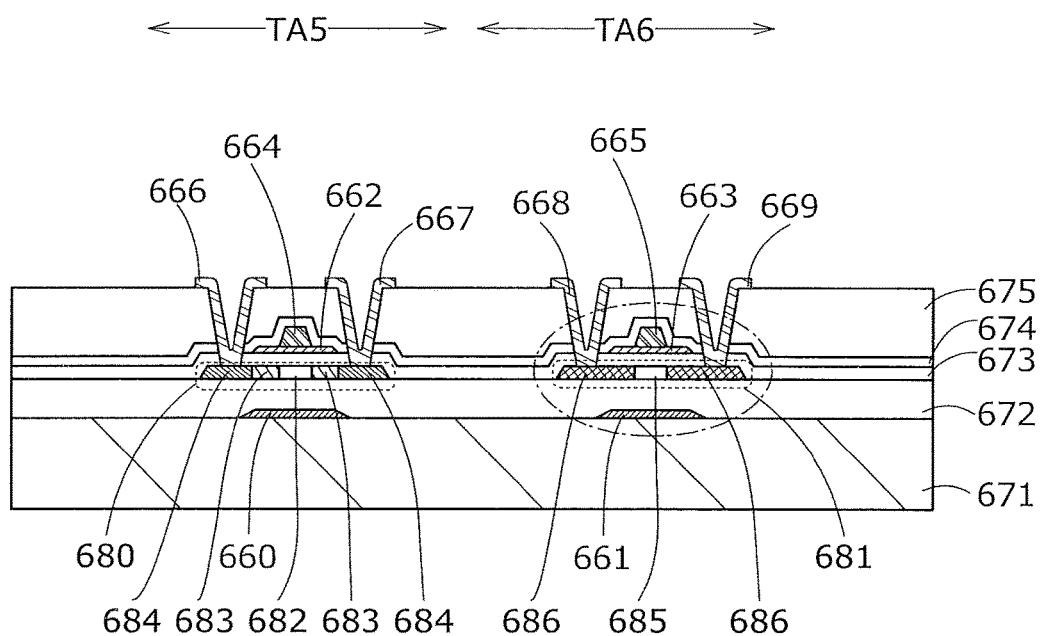
FIG. 19 illustrates a structure example of transistors.

FIG. 19 illustrates structure examples of top-gate transistors. The transistor TA5 in FIG. 19 is an n-channel transistor, and the transistor TA6 is a p-channel transistor. The transistors TA5 and TA6 are formed over a substrate 671 having an insulating surface.

The transistor TA5 includes a conductive layer 660, a conductive layer 662, a conductive layer 664, a conductive layer 666, a conductive layer 667, an insulating layer 672, an insulating layer 673, an insulating layer 674, an insulating layer 675, and a semiconductor layer 680. The transistor TA6 includes a conductive layer 661, a conductive layer 663, a conductive layer 665, a conductive layer 668, a conductive layer 669, the insulating layer 672, the insulating layer 673, the insulating layer 674, the insulating layer 675, and a semiconductor layer 681.

The semiconductor layers 680 and 681 each are formed using a silicon film. For example, the semiconductor layers 680 and 681 can be formed using amorphous silicon formed by a sputtering method or a vapor deposition method such as a plasma CVD method. Alternatively, polycrystalline silicon obtained by crystallization of amorphous silicon by laser annealing or the like can be used. Alternatively, a single crystal silicon layer obtained by separation of a surface portion by implantation of hydrogen ions or the like into a single crystal silicon wafer can be used.

As a crystallization method of the semiconductor layers 680 and 681, for example, a laser crystallization method using a laser beam or a crystallization method using a catalytic element can be given. Alternatively, a crystallization method using a catalytic element and a laser crystallization method may be combined. When a heat-resistant substrate such as quartz is used as the substrate 671, it is possible to use a combination of a thermal crystallization method which uses an electrically-heated furnace, a lump anneal crystallization method which uses infrared light, a crystallization method which uses a catalytic element, and high-temperature annealing at approximately 950° C.

The insulating layer 672 includes regions functioning as insulating layers of the transistor TA5 and the transistor TA6. The semiconductor layer 680 includes a channel region 682, a pair of LDD (Light Doped Drain) regions 683, and a pair of impurity regions 684. The channel region 682 is a region which overlaps with the conductive layer 664 of the semiconductor layer 680. The pair of impurity regions 684 functions as a source region and a drain region. To impart n-type conductivity, an impurity element, such as boron (B), aluminum (Al), or gallium (Ga), is added to the LDD regions 683 and the impurity regions 684. The semiconductor layer 681 includes a channel region 685 and a pair of impurity regions 686. The channel region 685 is a region which overlaps with the conductive layer 665 of the semiconductor layer 681. The pair of impurity regions 686 functions as a source region and a drain region. To impart p-type conductivity, an impurity element, such as phosphorus (P) or arsenic (As), is added to the impurity regions 686.

The conductive layer 660 and the conductive layer 661 are first-layer conductive layers. The conductive layer 660 includes a region functioning as a back gate electrode of the transistor TA5, and the conductive layer 661 includes a region functioning as a back gate electrode of the transistor TA6. The conductive layer 662 and the conductive layer 663 are second-layer conductive layers, and the conductive layer 664 and the conductive layer 665 are third-layer conductive layers. The conductive layer 664 has a smaller width in the channel length direction than the conductive layer 662, and the conductive layer 665 has a smaller width in the channel length direction than the conductive layer 663. In the conductive layer 662 and the conductive layer 664, a region which overlaps the semiconductor layer 680 with the insulating layer 673 positioned therebetween functions as a gate electrode of the transistor TA5.

The conductive layers 666-669 are fourth-layer conductive layers. The conductive layer 666 and the conductive layer 667 include regions functioning as a source electrode and a drain electrode of the transistor TA5 and are in contact with the semiconductor layer 680 in openings provided in the insulating layer 673 and the insulating layer 674. The conductive layer 668 and the conductive layer 669 include regions functioning as a source electrode and a drain electrode of the transistor TA6 and are in contact with the semiconductor layer 681 in openings provided in the insulating layer 673 and the insulating layer 674.

(Embodiment 4)

In this embodiment, a display device and a semiconductor device including a display device are described.

As described in Embodiment 2, with the use of a flexible display device, semiconductor devices such as a flexible electronic device and a flexible lighting device can be provided. When a flexible display device is incorporated in a display portion, an electronic device and a lighting device having high reliability and high resistance to repeated bending can be provided.

Examples of electronic devices include a television set (also referred to as a television or a television receiver), a monitor of a computer or the like, a digital camera, a digital video camera, a digital photo frame, a mobile phone (also referred to as a mobile phone device), a portable game machine, a portable information terminal, an audio reproducing device, a large game machine such as a pinball machine, and the like. The flexible electronic device and lighting device can be incorporated along a curved inside/outside wall surface of a house or a building or a curved interior/exterior surface of a car. FIGS. 20A to 20F show structure examples of electronic devices. Each display portion of the electronic devices in FIGS. 20A to 20F can incorporate the display device in Embodiment 2, for example.

Figure 20A:
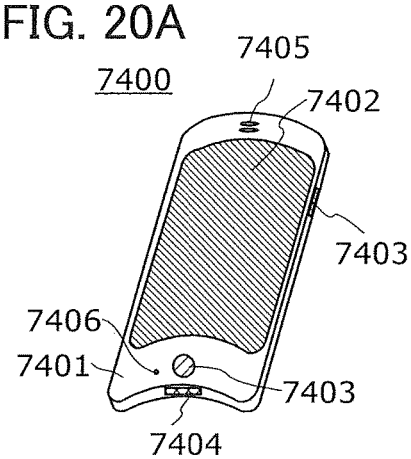
FIGS. 20A to 20F each illustrate a structure example of an electronic device.

A mobile phone 7400 in FIG. 20A includes a display portion 7402 incorporated in a housing 7401, operation buttons 7403, an external connection port 7404, a speaker 7405, a microphone 7406, and the like. Note that the mobile phone 7400 is manufactured by using the input/output device of one embodiment of the present invention for the display portion 7402. According to one embodiment of the present invention, a highly reliable mobile phone having a curved display portion can be provided with a high yield. When the display portion 7402 of the mobile phone 7400 is touched with a finger or the like, data can be input into the mobile phone 7400. Operations such as making a call and inputting letters can be performed by touch on the display portion 7402 with a finger or the like. With the operation buttons 7403, power on or off can be switched. In addition, types of images displayed on the display portion 7402 can be switched; for example, the image can be switched from a mail creation screen to a main menu.

Figure 20B:
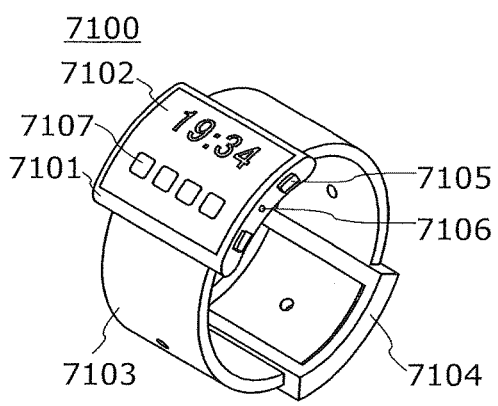

FIG. 20B illustrates an example of a wrist-watch-type portable information terminal. A portable information terminal 7100 in FIG. 20B includes a housing 7101, a display portion 7102, a band 7103, a buckle 7104, an operation button 7105, an input/output terminal 7106, and the like. The portable information terminal 7100 is capable of executing a variety of applications such as mobile phone calls, e-mailing, reading and editing texts, music reproduction, Internet communication, and a computer game. The display surface of the display portion 7102 is curved, and images can be displayed on the curved display surface. The display portion 7102 includes a touch sensor, and operation can be performed by touching the screen with a finger, a stylus, or the like. For example, by touching an icon 7107 displayed on the display portion 7102, an application can be started.

With the operation button 7105, a variety of functions such as time setting, power on/off, on/off control of wireless communication, setting and cancellation of silent mode, and setting and cancellation of power saving mode can be performed. For example, the functions of the operation button 7105 can be set freely by the operating system incorporated in the portable information terminal 7100. The portable information terminal 7100 can employ near field communication, which is a communication method based on an existing communication standard. In that case, for example, hands-free calling is possible with mutual communication between the portable information terminal 7100 and a headset capable of wireless communication. Since the portable information terminal 7100 includes the input/output terminal 7106, data can be directly transmitted to and received from another information appliance via a connector. Charging through the input/output terminal 7106 is possible. Note that the charging operation may be performed by wireless power feeding without using the input/output terminal 7106.

Figure 20C:
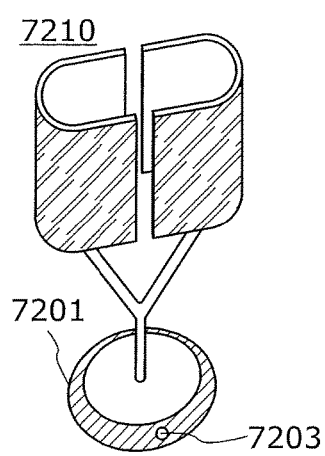

The display panel in Embodiment 2 can function as a flat-plate light source. In this case, it is appropriate to refer to the display panel as a light-emitting panel or a light source panel. FIG. 20C shows an example of an electronic device including such a light-emitting panel as a light source. A lighting device 7210 in FIG. 20C includes a stage 7201 provided with an operation switch 7203 and a light-emitting portion supported by the stage 7201. A display panel is incorporated in the light-emitting portion. The light-emitting portion may be fixed on a plastic member, a movable frame, or the like so that an emission surface of the light-emitting portion can be bent freely depending on the intended use. Although the lighting devices in which the light-emitting portion is supported by the stage are described as examples in FIG. 20C, a housing provided with a light-emitting portion can be fixed on a ceiling or suspended from a ceiling. Since the light-emitting surface can be curved, the light-emitting surface can be bent concavely so that a particular region is brightly illuminated, or bent convexly so that the whole room is brightly illuminated.

Figure 20D:
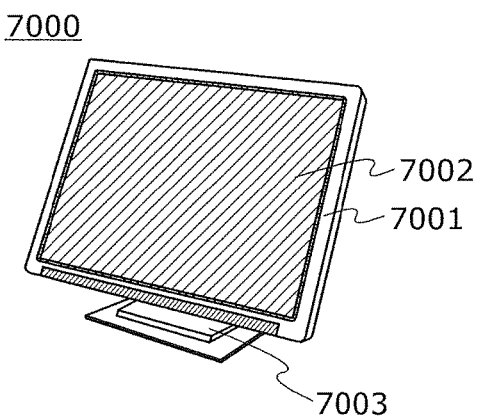

An electronic appliance and a lighting device in which one embodiment of the present invention is used are not limited to those having flexibility. FIG. 20D illustrates an example of such an electronic device. A display device 7000 in FIG. 20D includes a housing 7001, a display portion 7002, a support base 7003, and the like.

Figure 20E:
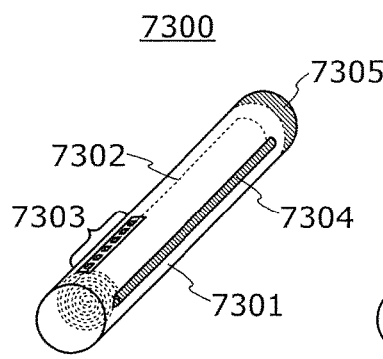
Figure 20F:
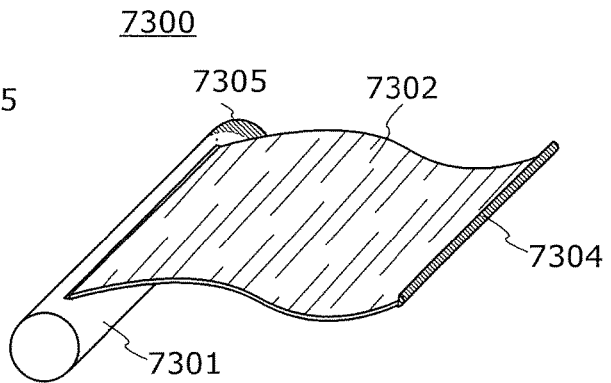

FIGS. 20E and 20F illustrate an example of a portable touch panel. A touch panel 7300 includes a housing 7301, a display portion 7302, operation buttons 7303, a display portion pull 7304, and a control portion 7305. The touch panel 7300 includes a rolled flexible display portion 7302 in the cylindrical housing 7301. The touch panel 7300 can receive a video signal with the control portion 7305 and can display the received video on the display portion 7302. In addition, a battery is included in the control portion 7305. Moreover, the control portion 7305 may include a terminal portion for connecting a connector so that a video signal or power can be directly supplied from the outside through a wire. By pressing the operation buttons 7303, power on/off, switching of displayed video, and the like can be performed.

FIG. 20F illustrates a touch panel 7300 in a state where the display portion 7302 is pulled out with the display portion pull 7304. Videos can be displayed on the display portion 7302 in this state. The operation buttons 7303 on the surface of the housing 7301 allow one-handed operation. The operation buttons 7303 are provided not in the center of the housing 7301 but on one side of the housing 7301 as illustrated in FIG. 20E, which makes one-handed operation easy. A reinforcement frame may be provided for a side portion of the display portion 7302 so that the display portion 7302 has a flat display surface when pulled out. Furthermore, a speaker may be incorporated in the housing 7301 so that sound is output with an audio signal received together with a video signal.

Figure 21A:
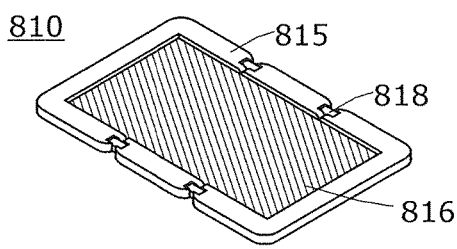
FIGS. 21A to 21I each illustrate a structure example of an electronic device.
Figure 21B:
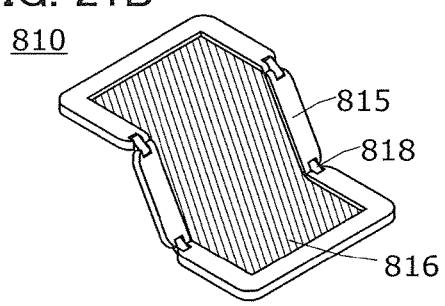
Figure 21C:
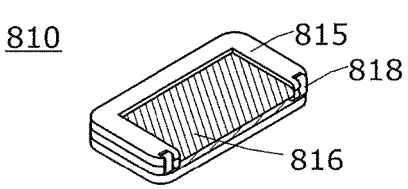

FIGS. 21A to 21C illustrate a structure example of a foldable portable information terminal 810. FIG. 21A illustrates the portable information terminal 810 that is opened. FIG. 21B illustrates the portable information terminal 810 that is being opened or being folded. FIG. 21C illustrates the portable information terminal 810 that is folded. The portable information terminal 810 is highly portable when folded, and is highly browsable when opened because of a seamless large display area.

A display panel 816 is supported by eight housings 815 joined together by hinges 818. By folding the portable information terminal 810 at a connection portion between two housings 815 with the hinges 818, the portable information terminal 810 can be reversibly changed in shape from an opened state to a folded state. For example, the display panel 816 can be a display panel provided with a touch panel that can be bent with a radius of curvature of 1 mm or more and 150 mm or less. A sensor that senses whether the display panel 816 is in a folded state or an unfolded state and supplies sensing data may be used. The operation of a folded portion (or a portion that becomes invisible by a user by folding) of the display panel 816 may be controlled to be stopped through the acquisition of data indicating the folded state of the display panel 816. Specifically, display of the portion may be stopped, and furthermore, sensing by the touch sensor may be stopped. Furthermore, display and sensing by a touch sensor may be controlled to restart through the acquisition of data indicating that the display panel 816 is opened.

Figure 21D:
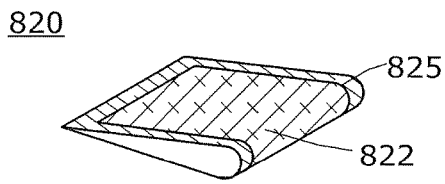
Figure 21E:
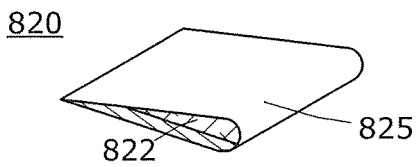

FIGS. 21D and 21E each illustrate a foldable portable information terminal 820. FIG. 21D illustrates the portable information terminal 820 that is folded so that a display portion 822 is on the outside. FIG. 21E illustrates the portable information terminal 820 that is folded so that the display portion 822 is on the inside. When the portable information terminal 820 is not used, the portable information terminal 820 is folded so that a non-display portion 825 faces the outside, whereby the display portion 822 can be prevented from being contaminated or damaged. The input device of one embodiment of the present invention can be used for the display portion 822.

Figure 21F:
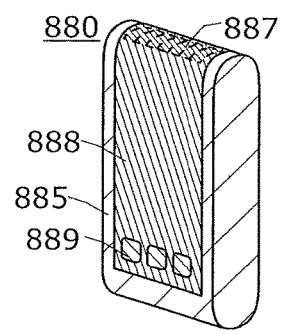
Figure 21G:
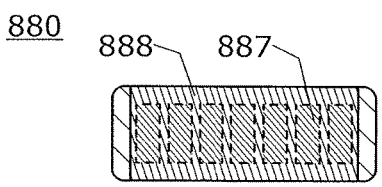
Figure 21H:
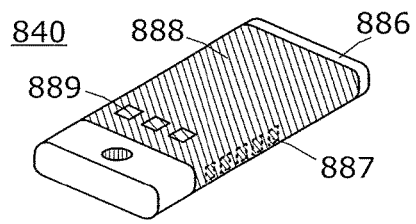

FIG. 21F is a perspective view illustrating an external shape of the portable information terminal 880. FIG. 21G is a top view of the portable information terminal 880. FIG. 21H is a perspective view illustrating an external shape of a portable information terminal 840.

The portable information terminals 840 and 880 each function as, for example, one or more of a telephone set, a notebook, and an information browsing system. Specifically, the portable information terminals 840 and 880 each can be used as a smartphone. The portable information terminals 840 and 880 can display characters and image information on its plurality of surfaces. For example, three operation buttons 889 can be displayed on one surface (FIGS. 21F and 21H). In addition, information 887 indicated by dashed rectangles can be displayed on another surface (FIGS. 21G and 21H). Examples of the information 887 include notification of a social networking service (SNS) message, display indicating reception of an email or an incoming call, the title of an e-mail or the like, the sender of an email or the like, the date, the time, remaining battery, and the reception strength of an antenna. Alternatively, the operation buttons 889, an icon, or the like may be displayed in place of the information 887.

Figure 21I:
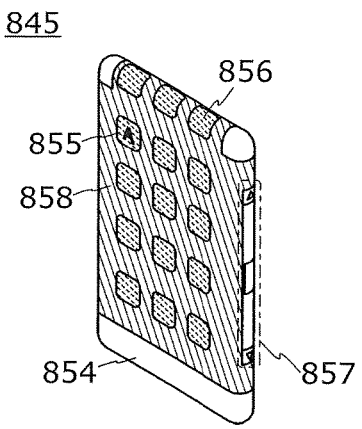

Although FIGS. 21F and 21G illustrate an example in which the information 887 is displayed at the top, one embodiment of the present invention is not limited thereto. The information 887 may be displayed, for example, on the side as in the portable information terminal 840 illustrated in FIG. 21H. For example, a user of the portable information terminal 880 can see the display (here, the information 887) with the portable information terminal 880 put in a breast pocket. Specifically, a caller's phone number, name, or the like of an incoming call is displayed in a position that can be seen from above the portable information terminal 880. Thus, the user can see the display without taking out the portable information terminal 880 from the pocket and decide whether to answer the call. As in a portable information terminal 845 illustrated in FIG. 21I, information may be displayed on three or more surfaces. Here, as an example, information 855, information 856, and information 857 are displayed on different surfaces.

EXPLANATION OF REFERENCE

ADC_CM: circuit, ANL: wiring, BGE1: electrode, BGE2: electrode, BGE3: electrode, C1: capacitor, CG1: opening, CG3: opening, DE1: electrode, DE2: electrode, DE3: electrode, DE4: electrode, EL1: light-emitting element, GC2: opening, GDL: circuit, GDR: circuit, GE1: electrode, GE2: electrode, GE3: electrode, GE4: electrode, GL: wiring, M1: transistor, M10: transistor, M2: transistor, M3: transistor, ML: wiring, MONT: circuit, MOUT: terminal, MS1: transistor, MS2: transistor, MS3: transistor, Msw1: transistor, Msw2: transistor, Msw3: transistor, N1: node, N2: node, OS1: layer, OS2: layer, OS3: layer, OS4: layer, OUT: terminal, PIN: terminal, POUT: terminal, SE1: electrode, SE2: electrode, SE3: electrode, SE4: electrode, SL: wiring, SW3: switch, SW50: switch, SW51: switch, SW52: switch, SW53: switch, SW54: switch, TA1: transistor, TA2: transistor, TA3: transistor, TA4: transistor, TA5: transistor, TA6: transistor, 10: driver IC, 20: circuit (SD), 21: test circuit, 30: analog-to-digital conversion circuit (ADC), 31: logic circuit (LGC), 32: circuit, 33: switch circuit, 34: pass transistor logic circuit (PTL), 35: logic circuit (LGC), 50: terminal, 51: terminal, 52: terminal, 60: terminal, 61: terminal, 62: terminal, 63: terminal, 64: terminal, 65: terminal, 66: terminal, 67: terminal, 68: terminal, 69: terminal, 100: semiconductor device, 110: circuit, 111: circuit, 112: wiring, 113: output terminal, 120: logic circuit (LGC), 121: logic circuit (LGC), 123: switch circuit, 124: read circuit (READ), 130: pass transistor logic circuit (PTL), 131: pass transistor logic circuit (PTL), 132: pass transistor logic circuit (PTL), 141: demultiplexer (DEMUX), 142: demultiplexer (DEMUX), 143: demultiplexer (DEMUX), 200: display device, 210: pixel portion, 211B: pixel, 211_G: pixel, 211_R: pixel, 211: pixel, 215: power supply line, 220a: peripheral circuit, 220: peripheral circuit, 221: gate driver circuit, 222: source driver circuit, 223: monitor circuit, 224: analog-to-digital conversion circuit (ADC), 230: CPU, 231: control circuit, 232: power supply circuit, 233: image processing device, 234: memory, 250: display panel, 251: printed board, 252: touch panel unit, 253: battery, 255:

FPC, 256: FPC, 258-1: upper cover, 258-2: lower cover, 259: frame, 260: substrate, 261: substrate, 262: region, 263: IC, 301: counter circuit, 302: level shift circuit (LS), 311: DEMUX, 312_1: DEMUX, 312_2: DEMUX, 312: DEMUX, 313_1: DEMUX, 313: DEMUX, 321: integrator circuit, 322: comparator, 323: counter circuit, 324: circuit, 331: circuit, 350: operational amplifier, 351: capacitor, 352: inverter, 353: latch circuit (LAT), 501: oxide semiconductor (OS) layer, 502: OS layer, 511: conductive layer, 512: conductive layer, 513: conductive layer, 521: conductive layer, 522: conductive layer, 523: conductive layer, 524: conductive layer, 531: conductive layer, 532: conductive layer, 533: conductive layer, 541: conductive layer, 542: conductive layer, 543: conductive layer, 544: conductive layer, 550: conductive layer, 551: conductive layer, 552: conductive layer, 553: EL layer, 555: light, 571: insulating layer, 572: insulating layer, 573: insulating layer, 574: insulating layer, 575: insulating layer, 576: insulating layer, 580: light-blocking layer, 581: color filter layer, 582: overcoat layer, 600: substrate, 621: insulating layer, 622: insulating layer, 623: insulating layer, 631: oxide semiconductor film, 632: oxide semiconductor film, 633: oxide semiconductor film, 650: substrate, 651: insulating layer, 652: insulating layer, 653: insulating layer, 654: insulating layer, 660: conductive layer, 661: conductive layer, 662: conductive layer, 663: conductive layer, 664: conductive layer, 665: conductive layer, 666: conductive layer, 667: conductive layer, 668: conductive layer, 669: conductive layer, 671: substrate, 672: insulating layer, 673: insulating layer, 674: insulating layer, 675: insulating layer, 680: semiconductor layer, 681: semiconductor layer, 682: channel region, 683: LDD region, 684: impurity region, 685: channel region, 686: impurity region, 810: portable information terminal, 815: housing, 816: display panel, 818: hinge, 820: portable information terminal, 822: display portion, 825: non-display portion, 840: portable information terminal, 845: portable information terminal, 855: information, 856: information, 857: information, 880: portable information terminal, 887: information, 889: operation button, 7000: display device, 7001: housing, 7002: display portion, 7003: support base, 7100: portable information terminal, 7101: housing, 7102: display portion, 7103: band, 7104: buckle, 7105: operation button, 7106: input/output terminal, 7107: icon, 7201: stage, 7203: operation switch, 7210: lighting device, 7300: touch panel, 7301: housing, 7302: display portion, 7303: operation button, 7304: pull, 7305: control portion, 7400: mobile phone, 7401: housing, 7402: display portion, 7403: operation button, 7404: external connection port, 7405: speaker, 7406: microphone.

This application is based on Japanese Patent Application serial no. 2014-181427 filed with Japan Patent Office on Sep. 5, 2014, the entire contents of which are hereby incorporated by reference.

The invention claimed is:

1. A semiconductor device comprising:
   r first input terminals (r is an integer of 2 or more);
   a second input terminal;
   r circuits;
   a pass transistor logic circuit comprising a demultiplexer; and
   a switch circuit,
   wherein the demultiplexer comprises r output terminals,
   wherein each of the r output terminals of the demultiplexer is electrically connected to a corresponding input terminal of input terminals of the r circuits,
   wherein an input terminal of the demultiplexer is electrically connected to the second input terminal,
   wherein each of the input terminals of the r circuits is electrically connected to a corresponding first input terminal of the r first input terminals, and
   wherein the switch circuit is configured to control electrical continuity between each of the input terminals of the r circuits and a corresponding first input terminal of the r first input terminals.

2. A driver IC of a display device comprising:
   the semiconductor device according to claim 1,
   wherein the display device comprises a pixel portion,
   wherein the pixel portion comprises a plurality of pixels, a plurality of first wirings, and a plurality of second wirings,
   wherein the plurality of second wirings are for extracting current flowing in the plurality of pixels,
   wherein the driver IC is configured to generate a data signal input to the plurality of first wirings, and
   wherein each of the r first input terminals is electrically connected to a corresponding second wiring of the plurality of second wirings.

3. The driver IC according to claim 2, wherein the display device is an electroluminescent display device.

4. A display device comprising:
   a pixel portion;
   a gate driver circuit:
   a source driver circuit; and
   an analog-to-digital conversion circuit,
   wherein the pixel portion comprises a plurality of pixels, a plurality of first wirings, a plurality of second wirings, and a plurality of third wirings,
   wherein the gate driver circuit is configured to drive the plurality of third wirings,
   wherein the source driver circuit is configured to drive the plurality of first wirings,
   wherein the analog-to-digital conversion circuit is configured to convert signals of the plurality of third wirings into digital signals,
   wherein the source driver circuit and the analog-to-digital conversion circuit are divided into a plurality of driver ICs,
   wherein at least one of the plurality of driver ICs comprises r first input terminals (r is an integer of 2 or more), a second input terminal, r circuits, a pass transistor logic circuit comprising a demultiplexer, and a switch circuit,
   wherein the demultiplexer comprises r output terminals,
   wherein each of the r output terminals of the demultiplexer is electrically connected to a corresponding input terminal of input terminals of the r circuits,
   wherein an input terminal of the demultiplexer is electrically connected to the second input terminal,
   wherein the r circuits are circuits included in the analog-to-digital conversion circuit,
   wherein the r circuits are configured to convert an input signal into a digital signal, and
   wherein each of the input terminals of the r circuits is electrically connected to a corresponding first input terminal of the r first input terminals through the switch circuit.

5. The display device according to claim 4, wherein the pixel portion comprises an electroluminescent element.

6. The display device according to claim 4,
   wherein each of the plurality of pixels comprises a transistor, and
   wherein the transistor comprises an oxide semiconductor layer in which a channel is formed.

7. An electronic device comprising:
the display device according to claim 4; and
a touch sensor.

* * * * *